(12) United States Patent
Kim et al.

(10) Patent No.: US 11,887,966 B2
(45) Date of Patent: Jan. 30, 2024

(54) SEMICONDUCTOR PACKAGES

(71) Applicant: SAMSUNG ELECTRONICS CO., LTD., Suwon-si (KR)

(72) Inventors: Jinnam Kim, Suwon-si (KR); Seokho Kim, Suwon-si (KR); Hoonjoo Na, Suwon-si (KR); Kwangjin Moon, Suwon-si (KR)

(73) Assignee: Samsung Electronics Co., Ltd.

( * ) Notice: Subject to any disclaimer, the term of this patent is extended or adjusted under 35 U.S.C. 154(b) by 217 days.

(21) Appl. No.: 17/376,784

(22) Filed: Jul. 15, 2021

(65) Prior Publication Data
US 2022/0093567 A1 Mar. 24, 2022

(30) Foreign Application Priority Data
Sep. 23, 2020 (KR) .................. 10-2020-0122861

(51) Int. Cl.
*H01L 25/065* (2023.01)
*H01L 25/18* (2023.01)
*H01L 23/48* (2006.01)
*H01L 23/00* (2006.01)

(52) U.S. Cl.
CPC ........ *H01L 25/0657* (2013.01); *H01L 23/481* (2013.01); *H01L 24/05* (2013.01); *H01L 24/08* (2013.01); *H01L 24/16* (2013.01); *H01L 24/48* (2013.01); *H01L 25/18* (2013.01); *H01L 2224/05147* (2013.01); *H01L 2224/08145* (2013.01); *H01L 2224/16227* (2013.01); *H01L 2224/48227* (2013.01); *H01L 2225/06541* (2013.01)

(58) Field of Classification Search
CPC .................... H01L 23/481; H01L 25/0657
See application file for complete search history.

(56) References Cited

U.S. PATENT DOCUMENTS

| 7,312,405 | B2 | 12/2007 | Hsu | |
|---|---|---|---|---|
| 8,703,542 | B2 | 4/2014 | Lin et al. | |
| 9,385,095 | B2 | 7/2016 | Jeng et al. | |
| 10,068,877 | B2 | 9/2018 | Lee et al. | |
| 10,510,703 | B2 | 12/2019 | Chi et al. | |
| 2011/0115071 | A1 | 5/2011 | Smeys et al. | |
| 2015/0348943 | A1* | 12/2015 | Chen | H01L 24/89 |
| | | | | 257/734 |
| 2017/0062383 | A1 | 3/2017 | Yee et al. | |
| 2017/0358558 | A1* | 12/2017 | Lee | H01L 23/481 |

(Continued)

FOREIGN PATENT DOCUMENTS

| CN | 107845625 A | * | 3/2018 | ........... H01L 21/486 |
|---|---|---|---|---|
| CN | 111211102 A | * | 5/2020 | ........... H01L 21/561 |

*Primary Examiner* — Mamadou L Diallo
(74) *Attorney, Agent, or Firm* — Myers Bigel, P.A.

(57) ABSTRACT

A semiconductor package includes a first structure including a first semiconductor chip, and a second structure on the first structure. The second structure includes a second semiconductor chip, a semiconductor pattern horizontally spaced apart from the second semiconductor chip and on a side surface of the second semiconductor chip, an insulating gap fill pattern between the second semiconductor chip and the semiconductor pattern, and through-electrode structures. At least one of the through-electrode structures penetrates through at least a portion of the second semiconductor chip or penetrates through the semiconductor pattern.

20 Claims, 30 Drawing Sheets

(56) References Cited

U.S. PATENT DOCUMENTS

| | | | |
|---|---|---|---|
| 2019/0326252 A1 | 10/2019 | Mandalapu et al. | |
| 2020/0303301 A1* | 9/2020 | Chen | H01L 23/5226 |
| 2021/0020535 A1* | 1/2021 | Ko | H01L 21/561 |
| 2021/0082779 A1* | 3/2021 | Chen | H01L 24/20 |
| 2021/0134748 A1* | 5/2021 | Liu | H01L 25/18 |
| 2021/0225809 A1* | 7/2021 | Yu | H10B 12/315 |
| 2021/0265313 A1* | 8/2021 | Chen | H01L 23/528 |
| 2021/0305226 A1* | 9/2021 | Tsai | H01L 21/6835 |
| 2021/0375819 A1* | 12/2021 | Chen | H01L 24/80 |
| 2021/0375826 A1* | 12/2021 | Chen | H01L 24/80 |
| 2022/0068745 A1* | 3/2022 | Li | H01L 21/76801 |
| 2022/0077117 A1* | 3/2022 | Yu | H01L 23/485 |
| 2022/0093564 A1* | 3/2022 | Chen | H01L 25/18 |
| 2022/0181458 A1* | 6/2022 | Kim | H01L 25/0652 |
| 2022/0384374 A1* | 12/2022 | Yu | H01L 24/20 |
| 2023/0067035 A1* | 3/2023 | Chen | H01L 21/76877 |

\* cited by examiner

SEMICONDUCTOR PACKAGES

CROSS-REFERENCE TO RELATED APPLICATION(S)

This U.S. nonprovisional application claims the benefit and priority under 35 U.S.C. § 119 of Korean Patent Application No. 10-2020-0122861 filed on Sep. 23, 2020, in the Korean Intellectual Property Office, the entire disclosure of which is incorporated herein by reference.

BACKGROUND

The present inventive concepts relate to semiconductor packages, and more particularly, to semiconductor packages including a stacked chip structure.

Recently, in the electronic product market, demand for portable devices has been rapidly increasing, and for this reason, interest in miniaturization and weight reduction of electronic components mounted in such electronic products is continuously increasing. In order to reduce the size and weight of electronic components, a semiconductor package mounted thereon may process high-capacity data while the volume thereof is further reduced. There is a demand for high integration and single package of semiconductor chips mounted on such semiconductor packages.

SUMMARY

Example embodiments of the inventive concepts provide a semiconductor package including a plurality of stacked semiconductor chips.

According to an example embodiment, a semiconductor package is provided. The semiconductor package includes a first structure including a first semiconductor chip, and a second structure on the first structure. The second structure includes a second semiconductor chip, a semiconductor pattern spaced apart from the second semiconductor chip horizontally and on a side surface of the second semiconductor chip, an insulating gap fill pattern between the second semiconductor chip and the semiconductor pattern, and through-electrode structures. At least one of the through-electrode structures penetrates through at least a portion of the second semiconductor chip or penetrates through the semiconductor pattern.

According to an example embodiment, a semiconductor package is provided. The semiconductor package includes a first structure including a first semiconductor chip, and a second structure on the first structure. The second structure includes a bonding structure bonded to the first semiconductor chip, a second semiconductor chip on the bonding structure, a semiconductor pattern on the bonding structure and horizontally spaced apart from the second semiconductor chip, and an insulating gap fill pattern between the second semiconductor chip and the semiconductor pattern. The first semiconductor chip includes a first semiconductor substrate and a first circuit area, the second semiconductor chip includes a second semiconductor substrate and a second circuit area, and the first circuit area and the second circuit area are between the first semiconductor substrate and the second semiconductor substrate.

According to an example embodiment, a semiconductor package is provided. The semiconductor package includes a first semiconductor chip, a second semiconductor chip on the first semiconductor chip, a semiconductor pattern on the first semiconductor chip and horizontally spaced apart from the second semiconductor chip, and an insulating gap fill pattern between the second semiconductor chip and the semiconductor pattern. A distance between the semiconductor pattern and the second semiconductor chip is about 0.5 μm to about 10 μm, a thickness of the second semiconductor chip is about 3 μm to about 10 μm, a thickness of the first semiconductor chip is greater than the distance between the semiconductor pattern and the second semiconductor chip, and the thickness of the first semiconductor chip is greater than a thickness of the semiconductor pattern and the thickness of the second semiconductor chip.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the inventive concepts will be described with reference to the accompanying drawings.

Figure 1A:
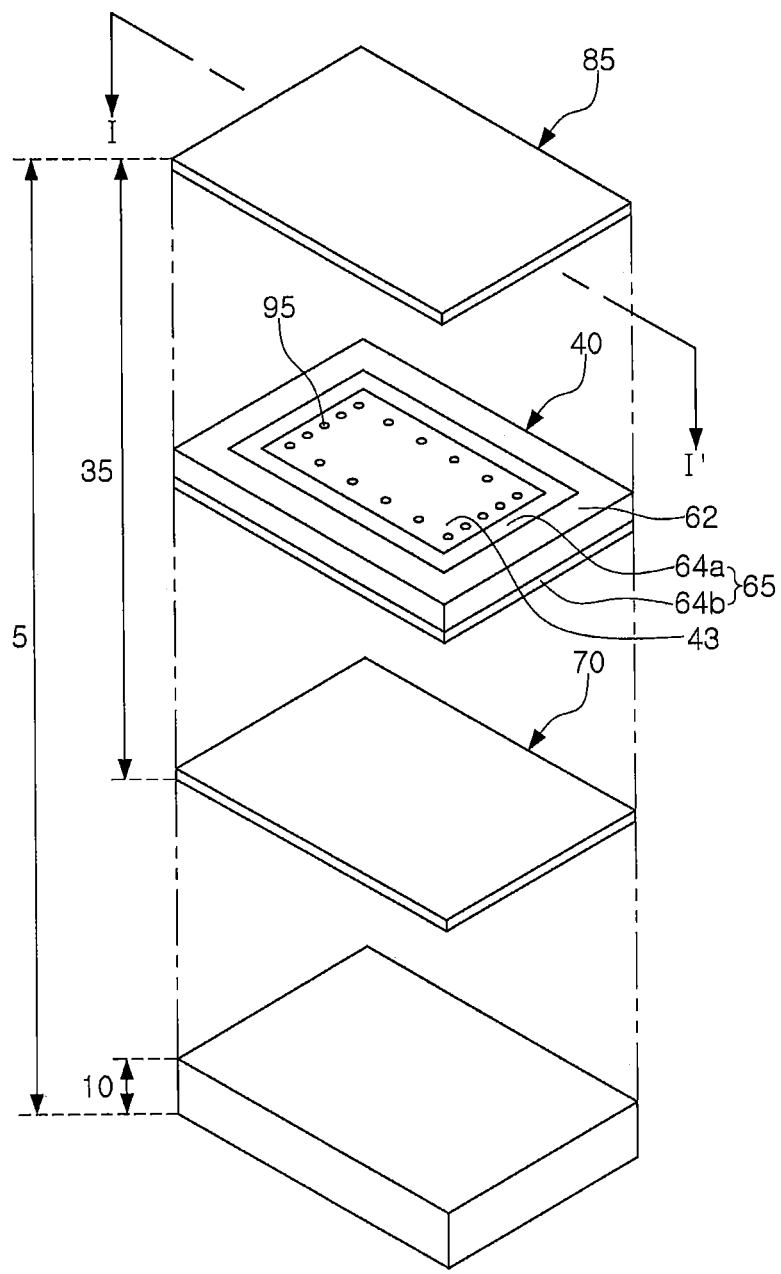
FIGS. 1A to 1C are views schematically illustrating a stacked chip structure of a semiconductor package according to an example embodiment of the inventive concepts.

A semiconductor package according to an example embodiment of the inventive concepts may include a stacked chip structure. An example of the stacked chip structure of a semiconductor package according to an example embodiment will be described with reference to FIGS. 1A to 1C. FIG. 1A is an exploded perspective view schematically illustrating an example of a stacked chip structure of a semiconductor package according to an example embodiment of the inventive concepts, and FIG. 1B is a schematic cross-sectional view illustrating an area taken along line I-I' of FIG. 1A.

Figure 1B:
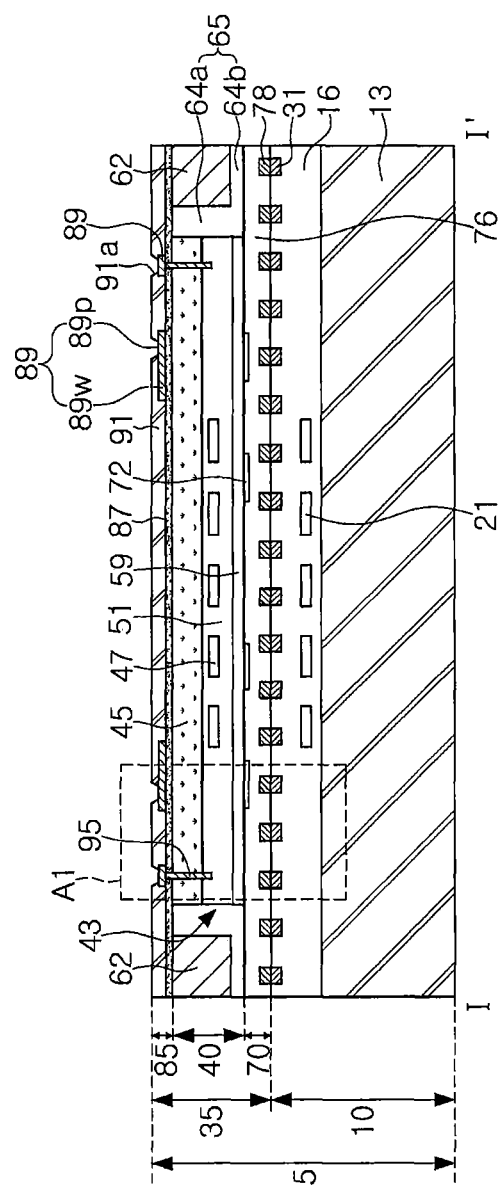

Referring to FIGS. 1A and 1B, a stacked chip structure 5 of a semiconductor package according to an example embodiment may include a first structure 10 and a second structure 35 on the first structure 10.

The first structure 10 may include a first semiconductor chip. In the discussion herein, the first structure 10 may also be referred to as the first semiconductor chip 10. For example, the first semiconductor chip of the first structure 10 may include a first semiconductor substrate 13 and a first circuit area 16 on the first semiconductor substrate 13. The first circuit area 16 may include a first circuit device 21 and first bonding pads 31 that may be electrically connected to the first circuit device 21.

In an embodiment, the first structure 10 may be referred to as a first semiconductor chip. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

The second structure 35 may include an intermediate structure 40. In an example, the second structure 35 may further include a bonding structure 70 between the intermediate structure 40 and the first structure 10. The first circuit area 16 may be disposed between the first semiconductor substrate 13 and the bonding structure 70.

In an example, the second structure 35 may further include a back side structure 85 on the intermediate structure 40. The intermediate structure 40 may be disposed between the back side structure 85 and the bonding structure 70. The back side structure 85 may be referred to as a capping structure.

The intermediate structure 40 may include a second semiconductor chip 43, a semiconductor pattern 62 horizontally spaced apart (e.g., in a direction that is parallel to an upper surface of the first semiconductor substrate 13) from the second semiconductor chip 43, and an insulating gap fill pattern 65 between the second semiconductor chip 43 and the semiconductor pattern 62.

In an example, the semiconductor pattern 62 may surround (e.g., in plan view) the second semiconductor chip 43. It will be understood that "an element A surrounds an element B" (or similar language) as used herein means that the element A is at least partially around the element B but does not necessarily mean that the element A completely encloses the element B. In an example, a distance between the semiconductor pattern 62 and the second semiconductor chip 43 may be about 0.5 µm to about 10 µm. In an example, a distance between the semiconductor pattern 62 and the second semiconductor chip 43 may be about 1 µm to about 4 µm. In an example, a distance between the semiconductor pattern 62 and the second semiconductor chip 43 may be about 2.5 µm to about 3.5 µm.

In an example, a thickness (e.g., in a direction that is vertical and/or perpendicular to an upper surface of the first semiconductor substrate 13) of the second semiconductor chip 43 may be about 3 µm to about 10 µm. As used herein, the term "and/or" includes any and all combinations of one or more of the associated listed items.

In an example, a thickness of the first structure 10 (for example, a thickness of the first semiconductor chip) may be greater than the distance between the semiconductor pattern 62 and the second semiconductor chip 43. In an example, the thickness of the first semiconductor chip 10 may be greater than the thickness of each of the semiconductor patterns 62 and the second semiconductor chip 43.

In an example, a width (e.g., in the horizontal direction) of the first semiconductor chip 10 may be greater than a width of the second semiconductor chip 43. In an example, the width of the second semiconductor chip 43 may be greater than a width of the semiconductor pattern 62.

The second semiconductor chip 43 may include a second semiconductor substrate 45, a second circuit area 51, and a protective insulating layer 59. The second circuit area 51 may be disposed between the second semiconductor substrate 45 and the bonding structure 70. The second circuit area 51 may include a second circuit device 47. The protective insulating layer 59 may be on and/or cover a surface of the second circuit area 51 adjacent to the bonding structure 70. The protective insulating layer 59 may contact the bonding structure 70.

The first circuit area 16 and the second circuit area 51 may be disposed between the first semiconductor substrate 13 and the second semiconductor substrate 45.

In an example, the semiconductor pattern 62 may be on and/or surround a side surface of the second semiconductor chip 43. For example, the semiconductor pattern 62 may have a quadrangular ring shape. An outer side surface of the semiconductor pattern 62 may be vertically aligned with the first structure 10 and/or a side surface of the first semiconductor chip 10.

The semiconductor pattern 62 may be formed of a silicon material and/or may be formed at the same height level as the second circuit area 51 (e.g., a horizontal line may pass through a portion of the semiconductor pattern 62 and a portion of the second circuit area 51). It some embodiments, the height level may refer to a distance (e.g., a vertical distance) with respect to the upper surface of the first semiconductor substrate 13. In some embodiments, the semiconductor pattern 62 may not include a semiconductor integrated circuit at a same height level as the second circuit area 51. For example, a portion of the semiconductor pattern 62 located at the same height level as the second semiconductor chip 43 may not include a semiconductor integrated circuit.

In an example, the thickness of the semiconductor pattern 62 may be greater than the thickness of the second semiconductor substrate 45 of the second semiconductor chip 43.

The insulating gap fill pattern 65 may include an insulating material such as silicon oxide or the like. In an example, the insulating gap fill pattern 65 may include a first portion 64a disposed between (e.g., in a horizontal direction) the semiconductor pattern 62 and the second semiconductor chip 43, and a second portion 64b disposed between (e.g., in a vertical direction) the semiconductor pattern 62 and the first structure 10. The first and second portions 64a and 64b of the insulating gap fill pattern 65 may contact the semiconductor pattern 62.

The bonding structure 70 may include an insulating layer 76, an intermediate connection wiring 72 in the insulating layer 76 that may be electrically connected to the second circuit device 47, and second bonding pads 78 that may be electrically connected to the intermediate connection wiring 72 in the insulating layer 76. The second bonding pads 78 may be bonded while being in contact with the first bonding pads 31 of the first structure 10.

The first bonding pads 31 and the second bonding pads 78 may include the same metal material. For example, the first bonding pads 31 and the second bonding pads 78 may include a copper material.

The back side structure 85 may include a back side insulating layer 87, back side conductive patterns 89 on the back side insulating layer 87, and a capping insulating layer 91 having openings 91a exposing pad regions 89p of the back side conductive patterns 89, on the back side conductive patterns 89. The back side insulating layer 87 may contact the intermediate structure 40. The back side insulating layer 87 may be referred to as a first capping insulating layer 87 and the capping insulating layer 91 may be referred to as a second capping insulating layer 91. The back side conductive patterns 89 may also be referred to as redistribution conductive patterns 89.

In the back side conductive patterns 89, a portion covered by the capping insulating layer 91 may be defined as a wiring region 89w or a redistribution region 89w. The back side insulating layer 87 may include an insulating material such as silicon oxide. The back side conductive patterns 89 may include a metal material such as copper or aluminum. The capping insulating layer 91 may include a material such as silicon nitride or polyimide.

In an example, the second structure 35 may further include through-electrode structures 95. At least one of the through-electrode structures 95 may penetrate through at least a portion of the second semiconductor chip 43, or the semiconductor pattern 62. For example, at least one of the through-electrode structures 95 may penetrate through at least a portion of the second semiconductor chip 43.

In an example, at least one of the first semiconductor chip 10 of the first structure 10 and the second semiconductor chip 43 of the second structure 35 may be a microprocessor, a graphic processor, a signal processor, a network processor, a chipset, an audio codec, a video codec, an application processor, or a memory chip. The memory chip may be a volatile memory chip or a nonvolatile memory chip. For example, the volatile memory chip may include dynamic random access memory (DRAM), static RAM (SRAM), thyristor RAM (TRAM), zero capacitor RAM (ZRAM), or twin transistor RAM (TTRAM). In addition, the nonvolatile memory chip may include, for example, a flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, nano floating gate memory, holographic memory, molecular electronics memory, or insulator resistance change memory.

In another example, one of the first semiconductor chip 10 of the first structure 10 and the second semiconductor chip 43 of the second structure 35 may be a volatile memory chip or a nonvolatile memory chip, and the other may be a control semiconductor chip for driving a memory chip.

In another example, one of the first semiconductor chip 10 of the first structure 10 and the second semiconductor chip 43 of the second structure 35 may be an image sensor chip, and the other may be a logic semiconductor chip.

Figure 1C:
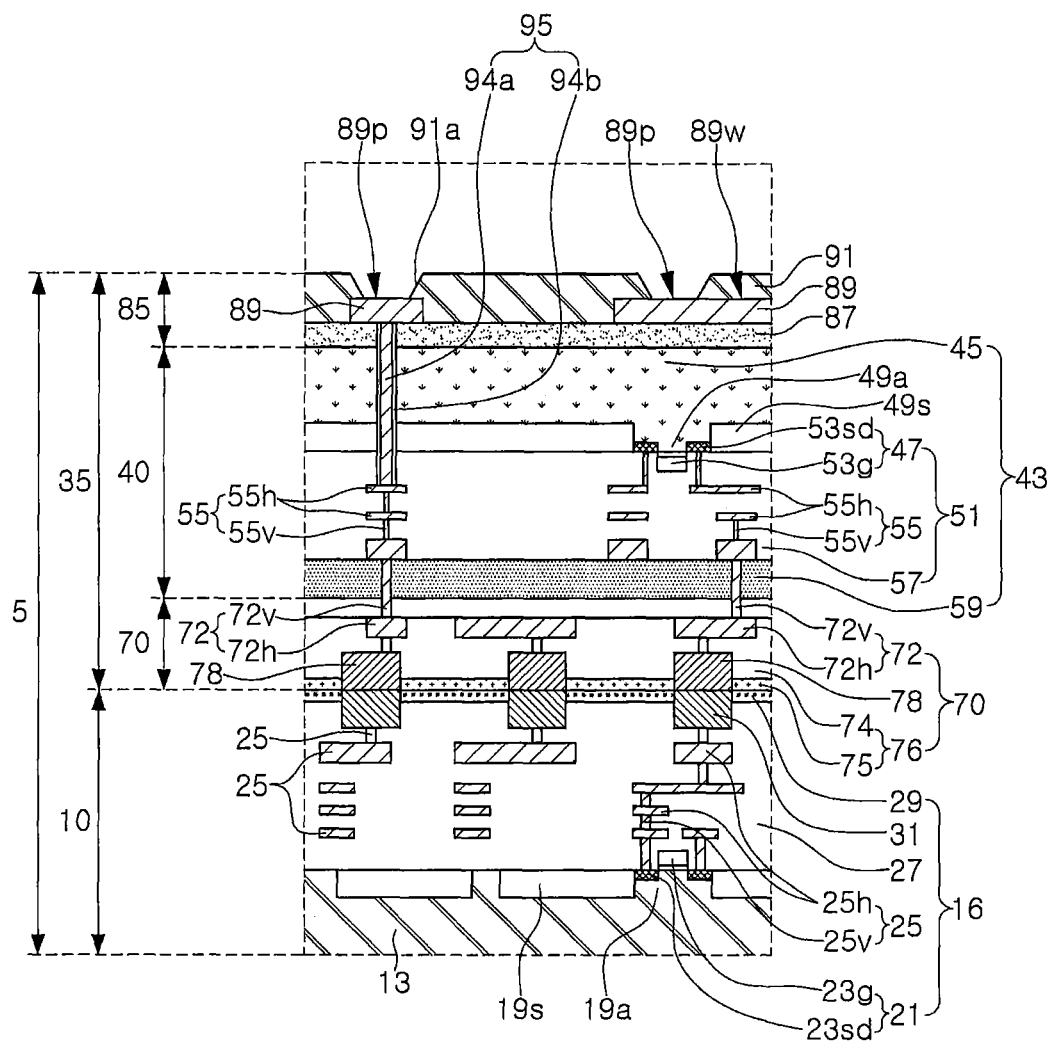

Next, examples of the first structure 10 and the second structure 35 will be described with reference to FIG. 1C. FIG. 1C is a partially enlarged cross-sectional view illustrating an example of a portion indicated by "A1" of FIG. 1B.

Referring to FIG. 1C, the first circuit area 16 of the first structure 10 may include a first isolation layer 19s defining a first active region 19a on the first semiconductor substrate 13, a first circuit device 21 on the first active region 19a, a first circuit wiring 25 that may be electrically connected to the first circuit device 21, first bonding pads 31 that may be electrically connected to and the first circuit wiring 25, a first bonding insulating layer 29 having an upper surface coplanar with upper surfaces of the first bonding pads 31 and surrounding side surfaces of the first bonding pads 31, and a first insulating structure 27 disposed between the first bonding insulating layer 29 and the first semiconductor substrate 13.

The first circuit wiring 25 may include a vertical portion 25v and a horizontal portion 25h in the first insulating structure 27, and may electrically connect the first bonding pads 31 and the first circuit device 21.

In an example, the first circuit device 21 may include a transistor including a gate 23g on the first active region 19a and a source/drain 23sd in the first active region 19a on both sides of the gate 23g. The first circuit device 21 is not limited to a transistor, and may include various devices constituting a semiconductor integrated circuit.

The second circuit area 51 of the second semiconductor chip 43 may include a second isolation layer 49s defining a second active region 49a below the second semiconductor substrate 45, the second circuit device 47 below the active region 49a, a second circuit wiring 55 that may be electrically connected to the second circuit device 47, and a second insulating structure 57 between the protective insulating layer 59 and the second semiconductor substrate 45. The second circuit wiring 55 may include a horizontal portion 55h and a vertical portion 55v, and may be electrically connected to the second circuit device 47. The back side insulating layer 87 may contact a back side of the second semiconductor substrate 45.

In an example, the second circuit device 47 may include a transistor including a gate 53g below the second active region 49a and a source/drain 53sd in the second active region 49a on both sides of the gate 53g. The second circuit device 47 is not limited to a transistor, and may include various devices constituting a semiconductor integrated circuit.

Each of the through-electrode structures 95 may include a through-electrode 94a and an insulating spacer 94b on and/or surrounding a side surface of the through-electrode 94a. In an example, the through-electrode structures 95 may extend to penetrate through the back side insulating layer 87. For example, the through-electrodes 94a of the through-electrode structures 95 may electrically connect the back side conductive patterns 89 and the second circuit wiring 55 of the second semiconductor chip 43.

The protective insulating layer 59 may include an insulating material such as silicon nitride. The second insulating structure 57 may include an insulating material such as silicon oxide in a region in contact with at least the protective insulating layer 59.

The bonding structure 70 may include a second bonding insulating layer 75 that may be bonded while contacting the first bonding insulating layer 29, the second bonding pads 78 that may be bonded while contacting the first bonding pads 31, an intermediate insulating layer 74 disposed between the second bonding insulating layer 75 and the intermediate structure 40, and an intermediate connection wiring 72 including a vertical portion 72v and a horizontal portion 72h in the intermediate insulating layer 74 and electrically connected to the second bonding pads 78. The bonding insulating layer 75 and the intermediate insulating layer 74 may be the insulating layer 76 of the bonding structure 70.

In an example, the first bonding insulating layer 29 and the second bonding insulating layer 75 may be formed of an insulating material, for example, silicon oxide that allows the first bonding insulating layer 29 and the second bonding insulating layer 75 to be in contact with each other and to be bonded to each other. The insulating material, which may bond and contact the first bonding insulating layer 29 and the second bonding insulating layer 75, is not limited to silicon oxide, but may be other insulating materials. For example, the first bonding insulating layer 29 and the second bonding insulating layer 75 may be formed of SiCN or the like.

A portion of the vertical portion 72v of the intermediate connection wiring 72 may extend into the second circuit area 51 to be electrically connected to the second circuit wiring 55.

Hereinafter, with reference to the drawings, description will be made focusing on the modified or replaced part of the stacked chip structure. In addition, descriptions of components of the substantially unmodified portion of the stacked chip structure will be omitted or described together with other components by directly referring thereto without separate descriptions.

Figure 2:
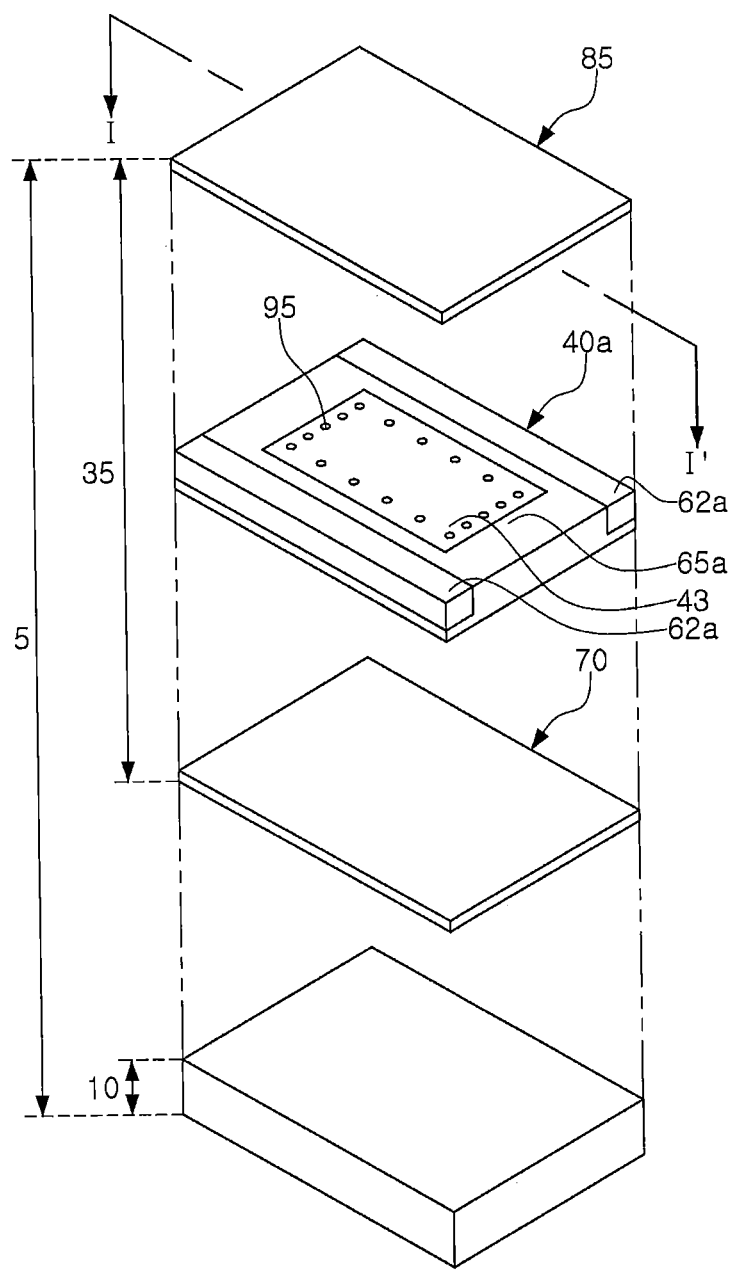
FIG. 2 is an exploded perspective view schematically illustrating a modified example of a stacked chip structure of a semiconductor package according to an example embodiment of the inventive concepts.

Next, a modified example of the intermediate structure 40 will be described with reference to FIG. 2. FIG. 2 is an exploded perspective view illustrating a modified example of the intermediate structure (40 in FIG. 1A) in the exploded perspective view of FIG. 1A.

In a modified example, referring to FIG. 2, an intermediate structure 40a may include the second semiconductor chip (43 in FIG. 1A), semiconductor patterns 62a, and an insulating gap fill pattern 65a. The semiconductor patterns 62a may have the shape of lines parallel to each other. The second semiconductor chip 43 may be disposed between the semiconductor patterns 62a. The insulating gap fill pattern 65a may be disposed between the semiconductor patterns 62a to surround a side surface of the second semiconductor chip 43, and may be disposed between the lower surface of the second semiconductor chip 43 and the bonding structure 70 and between the lower surfaces of the semiconductor patterns 62a and the bonding structure 70.

Figure 3A:
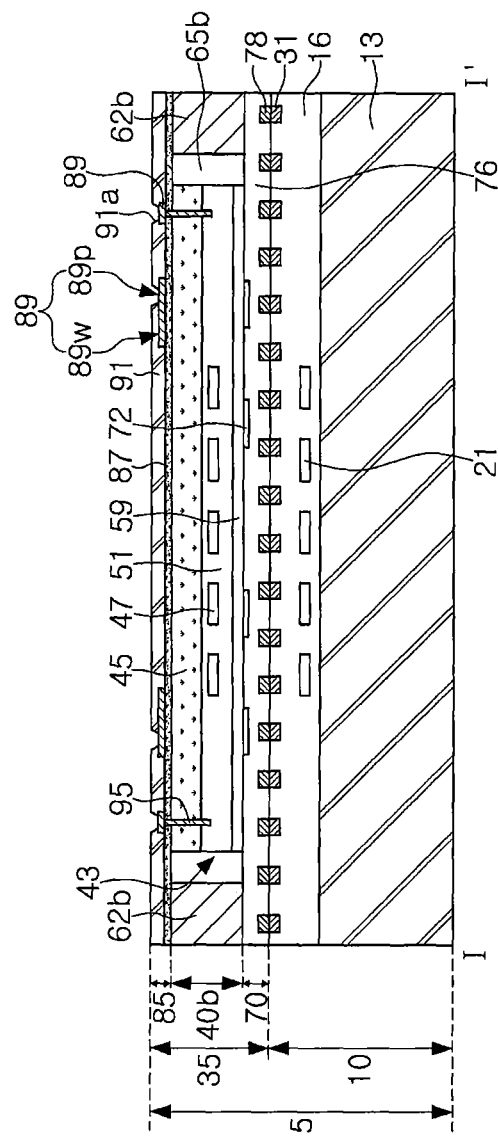
FIG. 3A is a schematic cross-sectional view illustrating a modified example of a stacked chip structure of a semiconductor package according to an example embodiment of the inventive concepts.

Next, another modified example of the intermediate structure 40 will be described with reference to FIG. 3A. FIG. 3A is a cross-sectional view illustrating a modified example of the intermediate structure (40 in FIG. 1B) in the cross-sectional view of FIG. 1B.

In a modified example, referring to FIG. 3A, the intermediate structure 40b may include the second semiconductor chip (43 in FIG. 1A), semiconductor patterns 62b, and an insulating gap fill pattern 65b. The insulating gap fill patterns 65b may be disposed between the second semiconductor chip 43 and the semiconductor patterns 62b. The semiconductor patterns 62b and the insulating gap fill pattern 65b may contact the bonding structure 70.

Figure 3B:
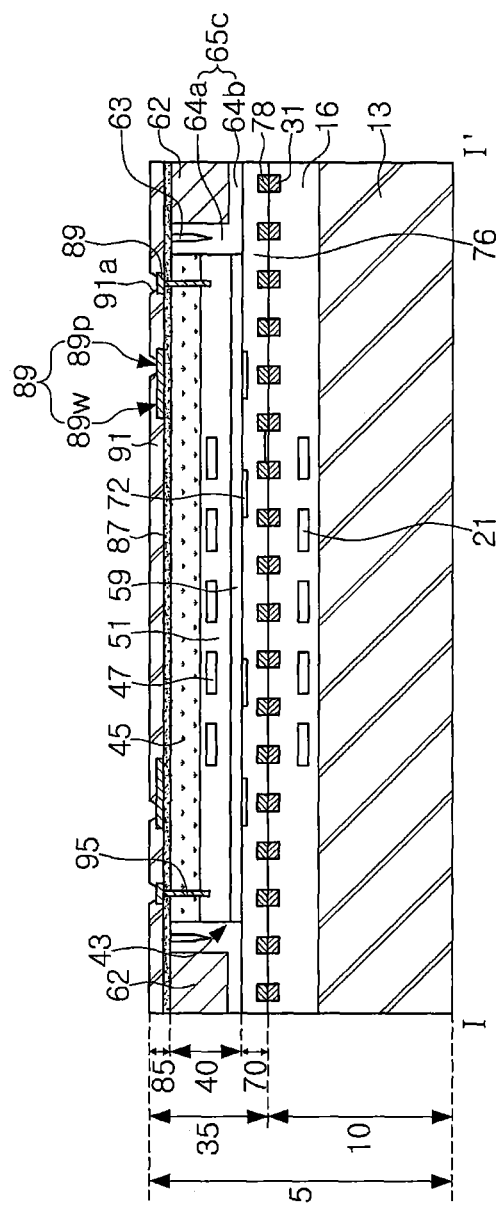
FIG. 3B is a schematic cross-sectional view illustrating a modified example of a stacked chip structure of a semiconductor package according to an example embodiment of the inventive concepts.

Next, another modified example of the intermediate structure 40 will be described with reference to FIG. 3B. FIG. 3B is a cross-sectional view illustrating a modified example of the insulating gap fill pattern 65 in the cross-sectional view of FIG. 1B.

In a modified example, referring to FIG. 3B, an insulating gap fill pattern 65c may further include an inner pattern 63. The inner pattern 63 of the insulating gap fill pattern 65c may be disposed within the first portion 64a of the insulating gap fill pattern 65c disposed between the semiconductor pattern 62 and the second semiconductor chip 43.

In an example, the inner pattern 63 may be a void, or within a void, in the first portion 64a of the insulating gap fill pattern 65c.

In an example, the inner pattern 63 extends from the back side insulating layer 87 to the inside (e.g., an internal portion) of the first portion 64a of the insulating gap fill pattern 65c, and may be formed of the same material as the back side insulating layer 87.

Figure 3C:
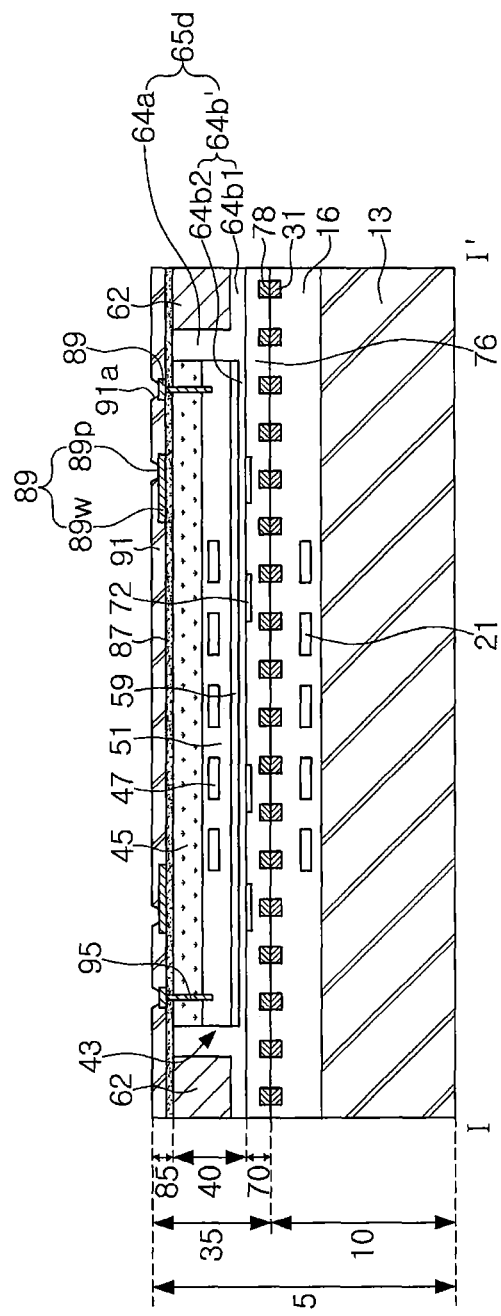
FIG. 3C is a schematic cross-sectional view illustrating a modified example of a stacked chip structure of a semiconductor package according to an example embodiment of the inventive concepts.

Next, another modified example of the intermediate structure 40 will be described with reference to FIG. 3C. FIG. 3C is a cross-sectional view illustrating a modified example of the insulating gap fill pattern 65 in the cross-sectional view of FIG. 1B.

In a modified example, referring to FIG. 3C, an insulating gap fill pattern 65d may include a first portion 64a and a second portion 64b' extending from the first portion 64a. The first portion 64a of the insulating gap fill pattern 65d may be disposed between (e.g., in a horizontal direction) the semiconductor pattern 62 and the second semiconductor chip 43. The second portion 6411' of the insulating gap fill pattern 65d may include a first region 64b1 disposed between (e.g., in the vertical direction) the semiconductor pattern 62 and the first structure 10, and a second region 64b2 disposed between (e.g., in the vertical direction) the second semiconductor chip 43 and the first structure 10.

Figure 4A:
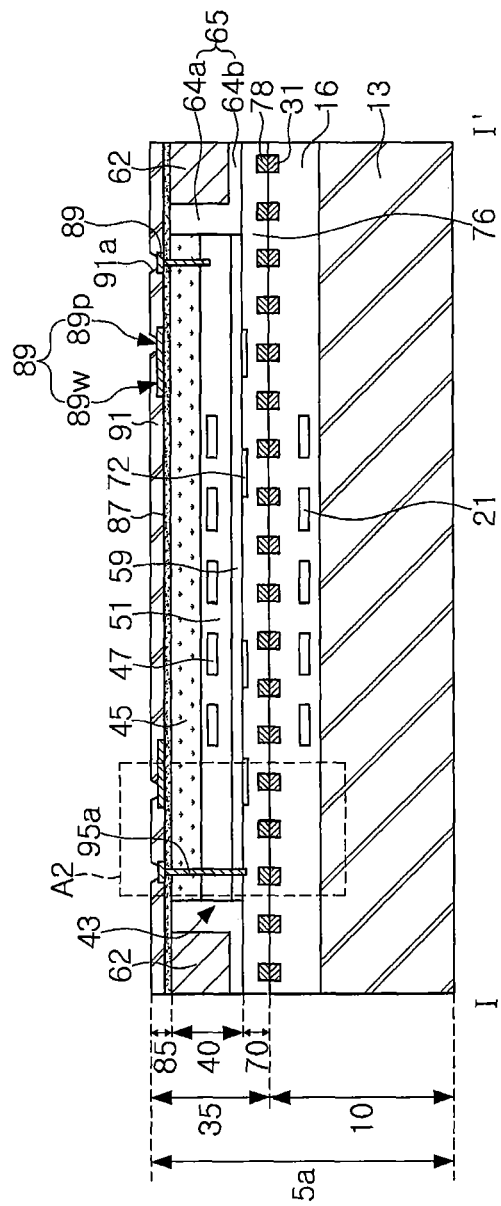
FIGS. 4A and 4B are cross-sectional views schematically illustrating a modified example of a stacked chip structure of a semiconductor package according to an example embodiment of the inventive concepts.

Next, a modified example of the through-electrode structure 95 described in FIGS. 1B and 1C will be described with reference to FIGS. 4A and 4B. FIG. 4A is a cross-sectional view illustrating a modified example of the through-electrode structure 95 in the cross-sectional view of FIG. 1B, and FIG. 4B is an enlarged cross-sectional view of a portion indicated by "A2" in FIG. 4A, to illustrate a modified example of the through-electrode structure 95 in the partially enlarged view of FIG. 1C.

Figure 4B:
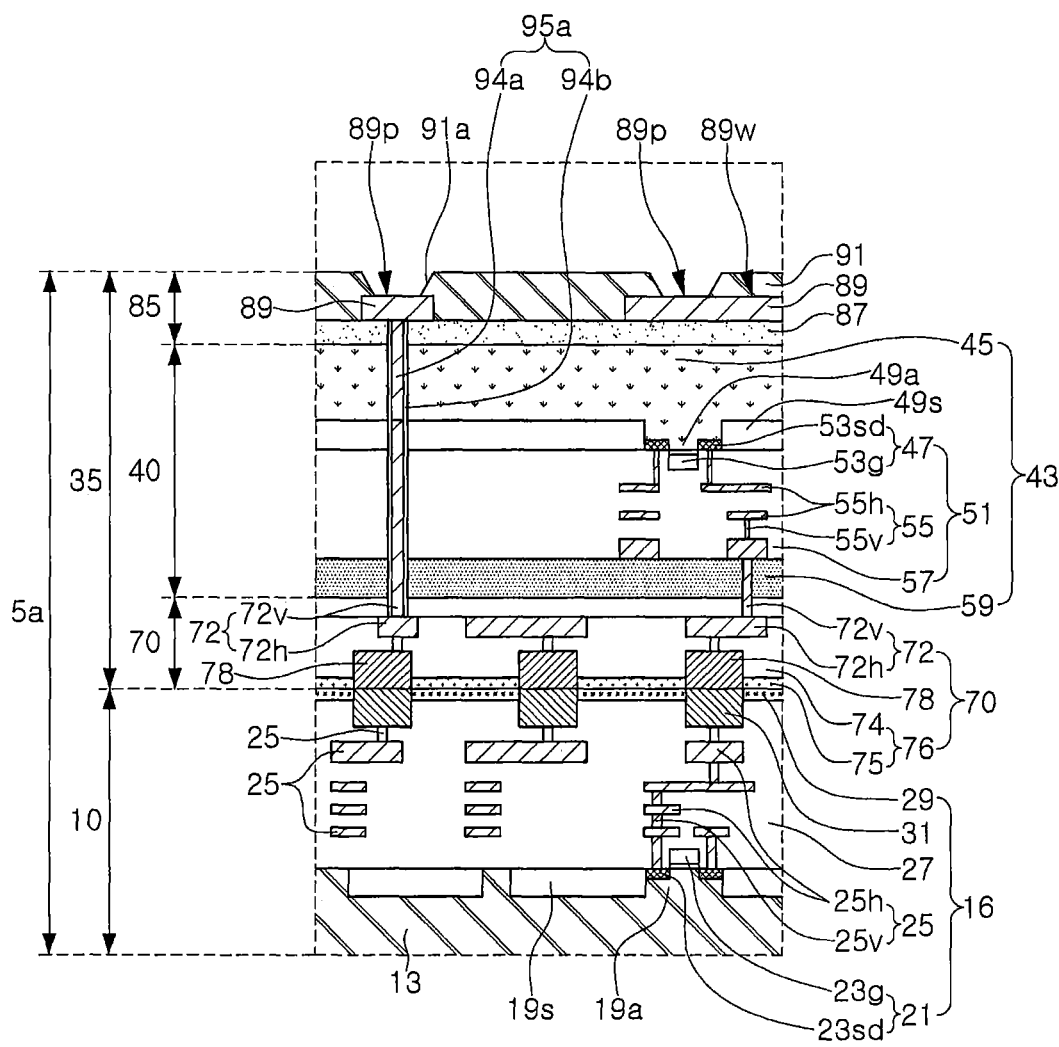

In a modified example, referring to FIGS. 4A and 4B, a stacked chip structure 5a may include through-electrode structures 95a penetrating through the second semiconductor chip 43.

Each of the through-electrode structures 95a may include a through-electrode 94a and an insulating spacer 94b surrounding a side surface of the through-electrode 94a. The through-electrodes 94a of the through-electrode structures 95a may electrically connect the intermediate connection wiring 72 of the bonding structure 70 and the back side conductive patterns 89.

Figure 5A:
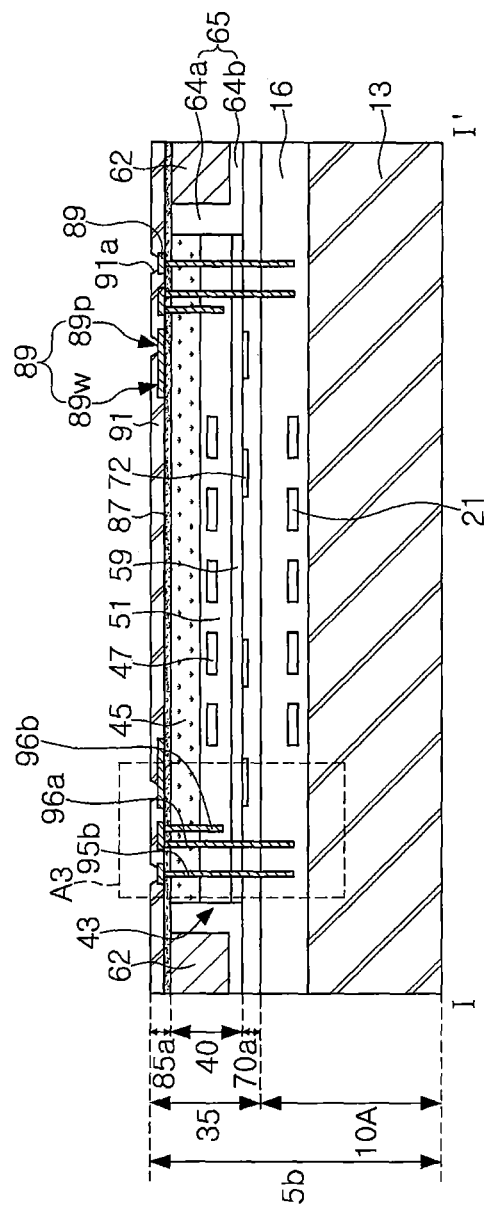
FIGS. 5A and 5B are cross-sectional views schematically illustrating a modified example of a stacked chip structure of a semiconductor package according to an example embodiment of the inventive concepts.

Next, a modified example of the first semiconductor chip 10, the bonding structure 70, and the through-electrode structure 95 described in FIGS. 1B and 1C will be described with reference to FIGS. 5A and 5B. FIG. 5A is a cross-sectional view illustrating a modified example of the first semiconductor chip 10, the bonding structure 70, the through-electrode structure 95, and the back side structure 85 of the cross-sectional view of FIG. 1B, and FIG. 5B is an enlarged view of a portion indicated by "A3" and is a cross-sectional view illustrating a modified example of the first semiconductor chip 10, the bonding structure 70, and the through-electrode structure 95 in the partially enlarged view of FIG. 1C.

Figure 5B:
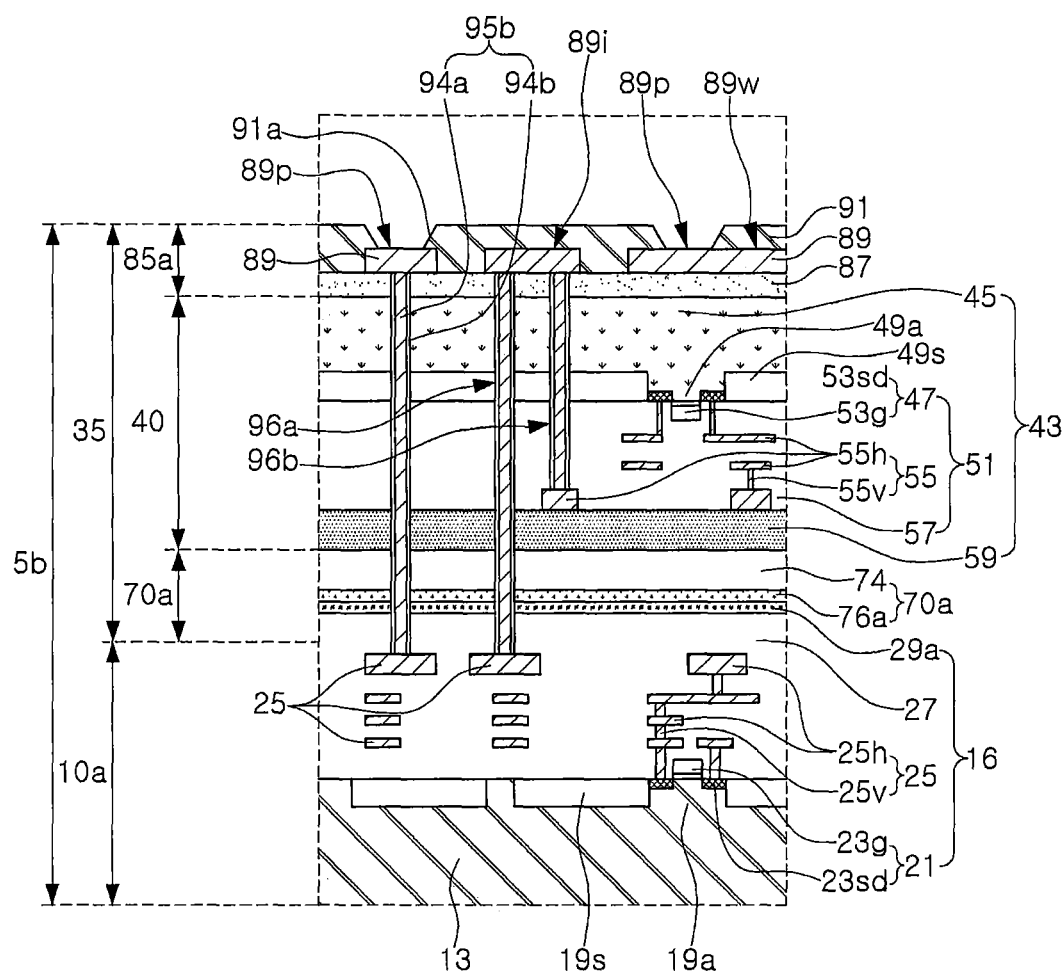

Referring to FIGS. 5A and 5B, a stacked chip structure 5b may include a first semiconductor chip 10a and a bonding structure 70a bonded by using a dielectric. For example, the first bonding insulating layer 29a of the first semiconductor chip 10a and the second bonding insulating layer 76a of the bonding structure 70a may be bonded while contacting each other. The bonding structure 70 may include an intermediate insulating layer 74 disposed between the bonding insulating layer 76a and the intermediate structure 40.

In an example, the first bonding insulating layer 29a and the second bonding insulating layer 76a may be formed of an insulating material, for example, silicon oxide, such that the first bonding insulating layer 29a and the second bonding insulating layer 76a may be bonded while contacting each other. As described above, the insulating material that may contact and bond the first bonding insulating layer 29a and the second bonding insulating layer 76a is not limited to silicon oxide, but may be other insulating materials. For example, the first bonding insulating layer 29a and the second bonding insulating layer 76a may be formed of SiCN or the like.

The stacked chip structure 5b may further include an input/output through-electrode structure 95b and a first connection through-electrode structure 96a, penetrating through the second semiconductor chip 43 and the bonding structure 70a and extending into the first semiconductor chip 10a, to be electrically connected to the first circuit wiring 25 of the first semiconductor chip 10a. The stacked chip structure 5b may further include a second connection through-electrode structure 96b penetrating through the second semiconductor substrate 45 of the second semiconductor chip 43 and electrically connected to the second circuit wiring 55 of the second semiconductor chip 43. The input/output through-electrode structure 95b and the first connection through-electrode structure 96a may have substantially the same length in the vertical direction, and the second connection through-electrode structure 96b may have a length in the vertical direction less than the length of the first connection through-electrode structure 96a in the vertical direction. Each of the input/output through-electrode structure 95b, the first connection through-electrode structure 96a, and the second connection through-electrode structure 96b may include a through-electrode 94a and an insulating spacer 94b surrounding a side surface of the through-electrode 94a.

The input/output through-electrode structure 95b, the first connection through-electrode structure 96a, and the second connection through-electrode structure 96b may extend into the back side structure 85a from a portion penetrating through the second semiconductor chip 43 and may penetrate through the back side insulating layer 87 of the back side structure 85a.

The back side structure 85a may further include the back side conductive pattern 89 that may be electrically connected to the input/output through-electrode structure 95b, and a connection conductive pattern 89i electrically connecting the first and second connection through-electrode structures 96a and 96b. In the back side conductive pattern 89, an area exposed by the opening 91a of the capping insulating layer 91 may be a pad area or an input/output pad area 89p. The entire upper surface of the connection conductive pattern 89i may be covered by the capping insulating layer 91.

Again, as described with reference to FIGS. 1A, 1B and 1C, the through-electrode structures 95 may be spaced apart from the semiconductor pattern 62. However, the present inventive concepts are not limited thereto. Hereinafter, the stacked chip structure may further include an outer through-electrode structure penetrating through the semiconductor pattern 62. Hereinafter, examples of a stacked chip structure further including an outer through-electrode structure penetrating through the semiconductor pattern 62 will be described.

Figure 6:
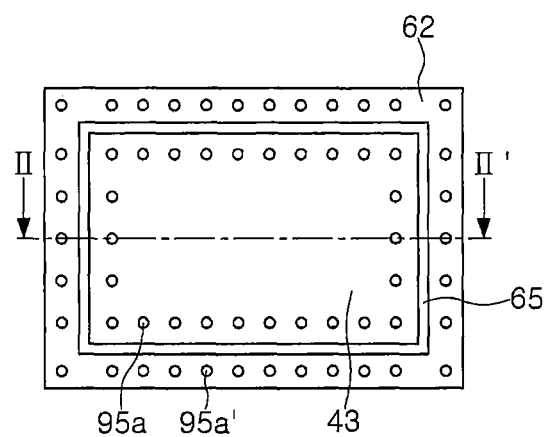
FIGS. 6 and 7 are diagrams schematically illustrating a modified example of a stacked chip structure of a semiconductor package according to an example embodiment of the inventive concepts.
Figure 7:
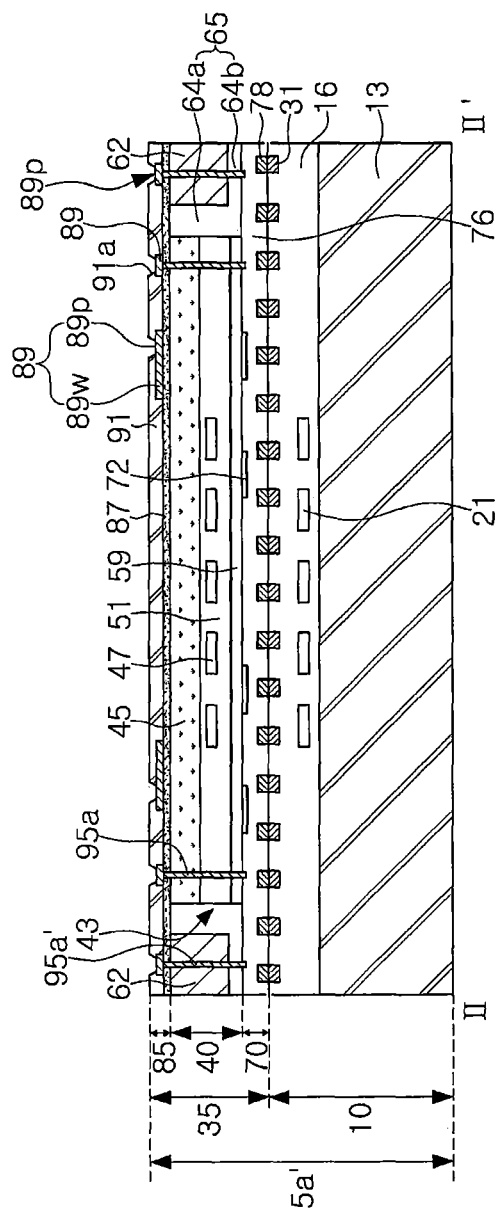

With reference to FIGS. 6 and 7, an example of a stacked chip structure further including an outer through-electrode structure penetrating through the semiconductor pattern 62 will be described. FIG. 6 is a plan view illustrating an example of a stacked chip structure further including an outer through-electrode structure penetrating through the semiconductor pattern 62, and FIG. 7 is a schematic cross-sectional view illustrating an area taken along line II-II' of FIG. 6.

Referring to FIGS. 6 and 7, a stacked chip structure 5a' may further include an outer through-electrode structure 95a' penetrating through the semiconductor pattern 62, as compared with that of the stacked chip structure 5a of FIGS. 4A and 4B. For example, the outer through-electrode structure 95a' may be formed of substantially the same material as the through-electrode structure 95a in FIGS. 4A and 4B, and may have substantially the same cross-sectional structure area as the through-electrode structure 95a. For example, the through-electrode structure 95a in FIGS. 4A and 4B penetrates through the second semiconductor chip 43 and extends downwardly to extend into the bonding structure 70, and the outer through-electrode structure 95a' may penetrate through the semiconductor pattern 62 and extend downwardly to extend into the bonding structure 70.

The outer through-electrode structure 95a' may be formed of substantially the same material as the through-electrode structure 95a of FIG. 4B described with reference to FIG. 4B and may have substantially the same cross-sectional structure area. For example, the outer through-electrode structure 95a' and the through-electrode structure 95a may electrically connect the back side conductive patterns 89 and the intermediate connection wiring 72 similarly to that described for the through-electrode structure (see 95a of FIG. 4B) in FIG. 4B.

In an example, the through-electrode structure 95a may be referred to as an inner through-electrode structure. In another example, in the stacked chip structure 5a', the inner through-electrode structure 95a may be omitted. Accordingly, the stacked chip structure 5a' may include the outer through-electrode structure 95a'.

Figure 8:
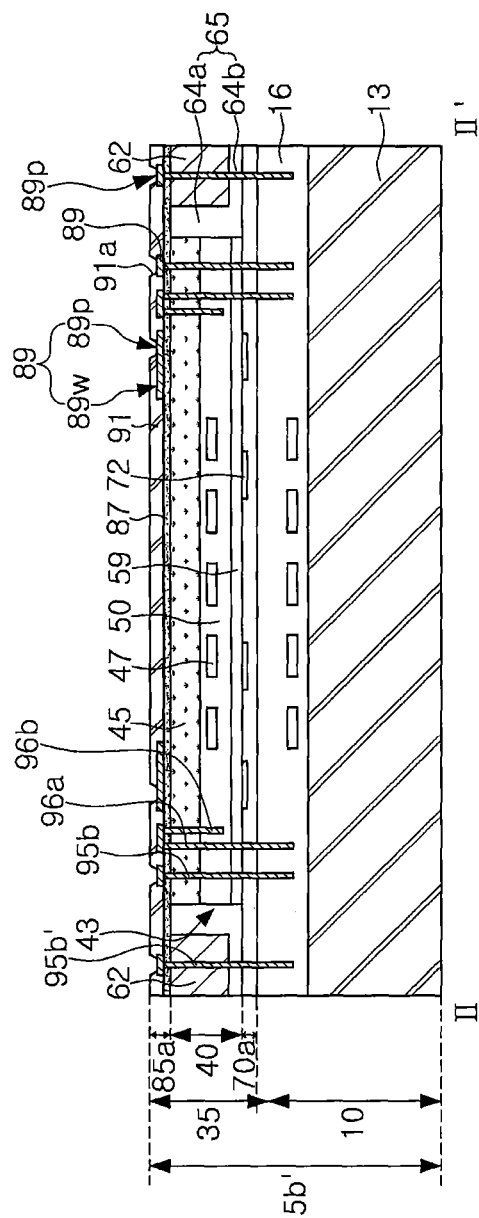
FIG. 8 is a schematic cross-sectional view illustrating a modified example of a stacked chip structure of a semiconductor package according to an example embodiment of the inventive concepts.

Next, with reference to FIG. 8, an example of a stacked chip structure further including an outer through-electrode structure penetrating through the semiconductor pattern 62 will be described. FIG. 8 is a schematic cross-sectional view illustrating an area taken along line II-II' of FIG. 6.

In a modified example, referring to FIG. 8, a stacked chip structure 5b' may further include an outer input/output through-electrode structure 95b' in addition to the stacked chip structure 5b of FIGS. 5A and 5B. The outer input/output penetrating electrode structure 95b' may penetrate through the semiconductor pattern 62 and the bonding structure 70a and extend into the first semiconductor chip 10.

The outer input/output through-electrode structure 95b' may be formed of substantially the same material as the input/output through-electrode structure 95b in FIGS. 5A and 5B, and may have substantially the same cross-sectional structure area as the input/output through-electrode structure 95b. For example, the outer input/output through-electrode structure 95b' and the input-output through-electrode structure 95a may electrically connect the back side conductive patterns 89 and the first circuit wiring 25 (see FIG. 5B) of the first semiconductor chip 10, similarly to those described for the input/output through-electrode structure (95b of FIG. 5B) in FIG. 5B.

In an example, the input/output through-electrode structure 95b may be referred to as an inner input/output through-electrode structure. In another example, in the stacked chip structure 5b', the inner input/output through-electrode structure 95b may be omitted.

Figure 9:
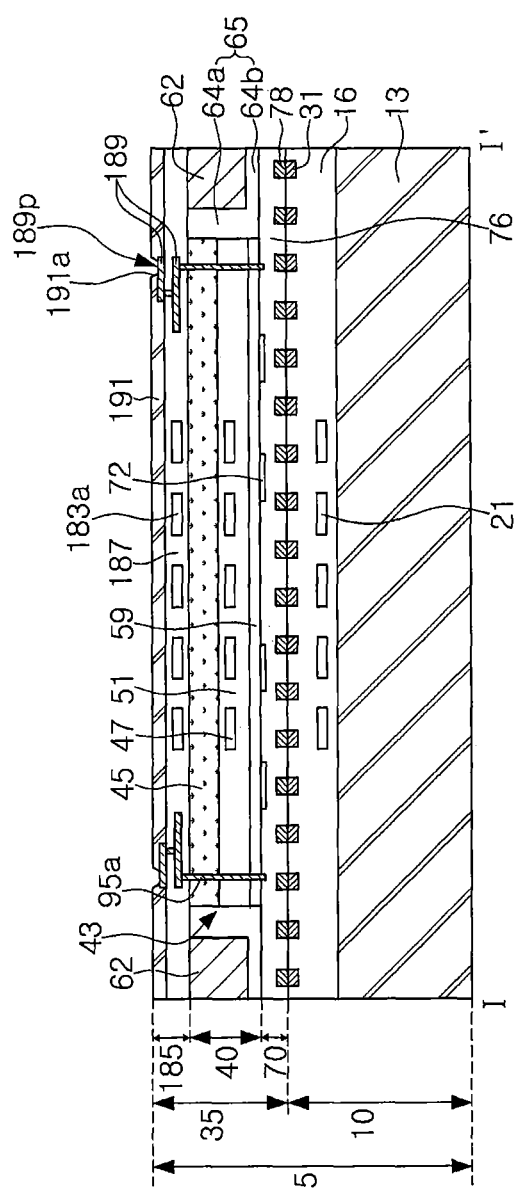
FIG. 9 is a schematic cross-sectional view illustrating a modified example of a stacked chip structure of a semiconductor package according to an example embodiment of the inventive concepts.
Figure 10:
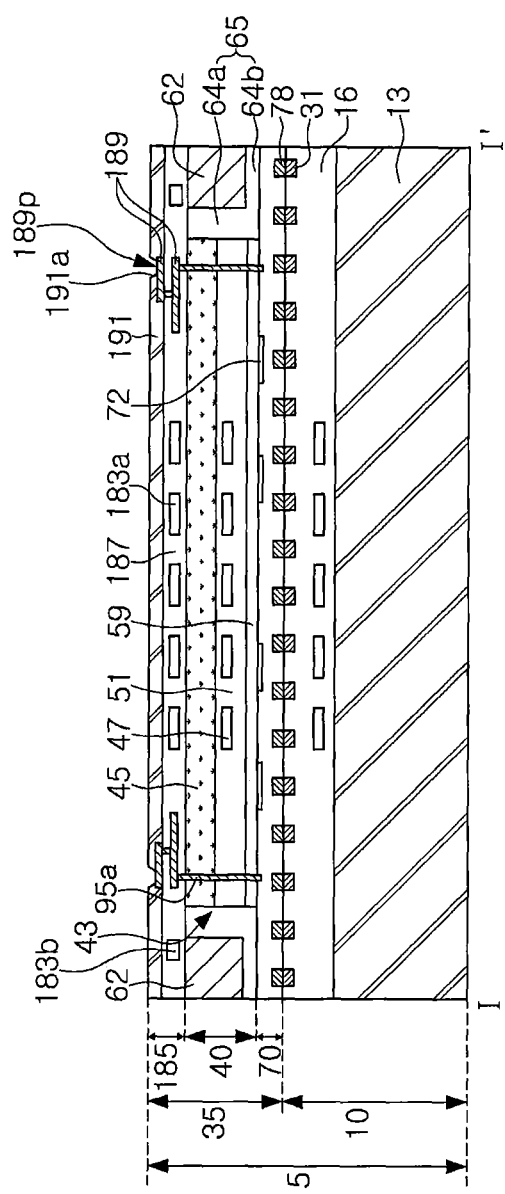
FIG. 10 is a schematic cross-sectional view illustrating a modified example of a stacked chip structure of a semiconductor package according to an example embodiment of the inventive concepts.

Next, a modified example of the back side structure 85 in FIGS. 1A to 8 will be described with reference to FIGS. 9 and 10, respectively. FIG. 9 is a cross-sectional view illustrating a modified example of the back side structure 85 in FIG. 4A, and FIG. 10 is a cross-sectional view illustrating a modified example of a back side structure 185 in FIG. 9.

In a modified example, referring to FIG. 9, at least one of the back side structures 85 described in FIGS. 1A to 8 may be replaced with the back side structure 185 including a first back side device 183a. For example, the back side structure in FIG. 4A (85 in FIG. 1B) may be replaced with the back side structure 185 including the first back side device 183a. Similarly, any one of the back side structures 85 and 85a in FIGS. 1B, 2, 3A, 3B, 5A, 7 and 8 may be replaced with the back side structure 185 including the first back side device 183a as in FIG. 9. The back side structure 185 as described above may include the first back side device 183a disposed on the second semiconductor substrate 45 of the second semiconductor chip 43, a back side insulating layer 187 on and/or covering the first back side device 183a, on the second semiconductor chip 43 and the semiconductor pattern 62, single-layered or multi-layered back side conductive patterns 189 disposed in the back side insulating layer 187, and a capping insulating layer 191 having openings 191a exposing pad regions 189p of the back side conductive patterns 189, on the back side insulating layer 187.

The first back side device 183a may vertically overlap the second semiconductor chip 43. A portion of the back side conductive patterns 189 may be electrically connected to the first back side device 183a. It will be understood that "an element A vertically overlapping an element B" (or similar language) as used herein means that at least one vertical line intersecting both the elements A and B exists.

The through-electrode structures 95a (95a as illustrated in FIG. 4A) may be electrically connected to the back side conductive patterns 189. Accordingly, at least one of the through-electrode structures 95a may electrically connect at least one of the first circuit device 21 and the second circuit device 47 to the first back side device 183a. Expressions such as "at least one of," when preceding a list of elements, modify the entire list of elements and do not modify the individual elements of the list.

In FIG. 9, the back side conductive patterns 189 are illustrated to be electrically connected to the through-electrode structures 95a as in FIG. 4A, but the present inventive concepts are not limited thereto. For example, the through-electrode structures 95a as in FIG. 4A may be replaced with the through-electrode structures 95b, 96a and 96b as in FIGS. 5A and 5B, the through-electrode structures 95a and 95a' as in FIG. 7, and the through-electrode structures 95b, 95b', 96a and 96b as in FIG. 8. Accordingly, the through-electrode structures 95a as in FIG. 4A, the through-electrode structures 95 as in FIGS. 1A and 1B, the through-electrode structures 95b, 96a and 96b as in FIGS. 5A and 5B, the through-electrode structures 95a and 95a' as in FIG. 7, and the through-electrode structures 95b, 95b', 96a and 96b as in FIG. 8 may be electrically connected to the back side conductive patterns 189 as in FIG. 9.

In a modified example, referring to FIG. 10, the back side structure 185 described in FIG. 9 further may include a second back side device 183b disposed on the semiconductor pattern 62 and covered by the back side insulating layer 187. The second back side device 183b may overlap the semiconductor pattern 62.

In an example, at least one of the first back side device (183a in FIG. 9 or 10) and the second back side device 183b may include at least one of an active device, a passive device, an image sensor, an optical connection unit, an analog device, and a memory device. For example, the active device may be a transistor, and the passive device may be a resistor, a capacitor, or an inductor. The memory device may be a volatile memory device or a nonvolatile memory device. For example, the memory device may be a nonvolatile memory device such as MRAM.

Figure 11A:
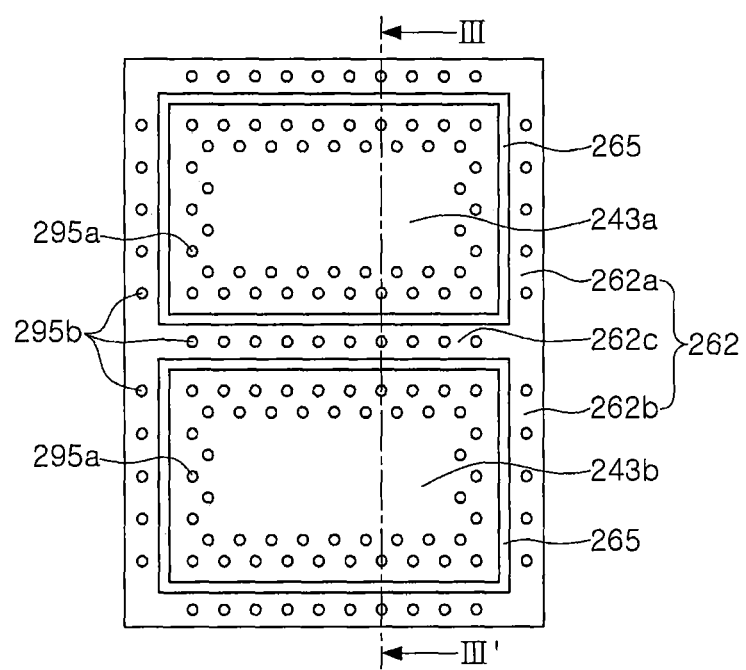
FIGS. 11A and 11B are diagrams schematically illustrating a modified example of a stacked chip structure of a semiconductor package according to an example embodiment of the inventive concepts.

Next, a stacked chip structure according to an example embodiment will be described with reference to FIGS. 11A and 11B. FIG. 11A is a schematic plan view of an example embodiment of the inventive concepts, and FIG. 11B is a schematic cross-sectional view taken along the line of FIG. 11A.

Figure 11B:
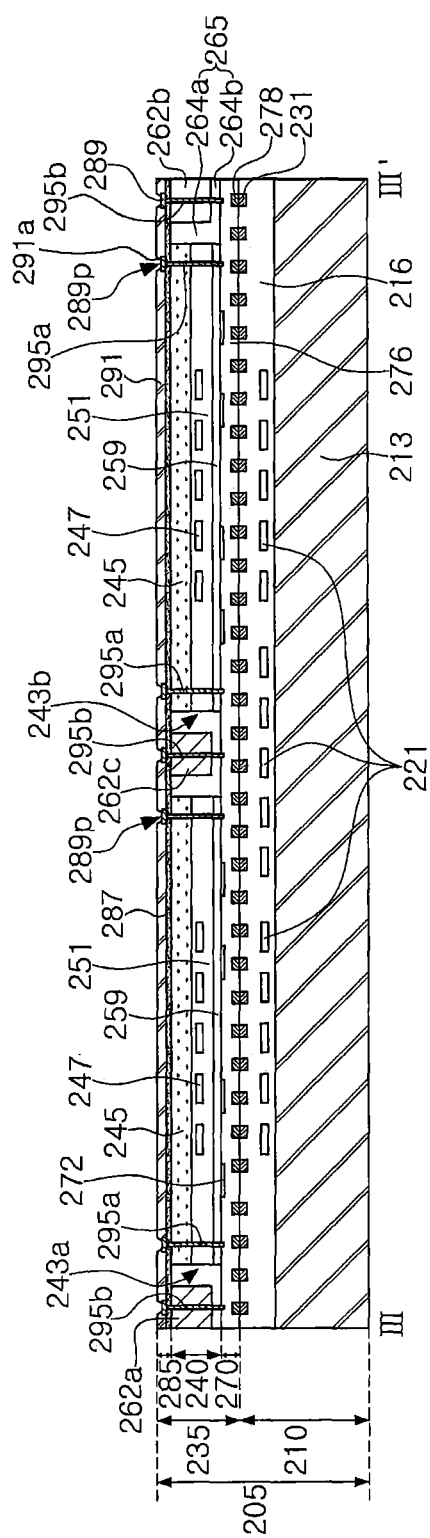

Referring to FIGS. 11A and 11B, a stacked chip structure 205 of a semiconductor package according to an example embodiment may include a first structure 210 and a second structure 235 on the first structure 210.

The first structure 210 may be a first semiconductor chip. For example, the first semiconductor chip of the first structure 210 may include a first semiconductor substrate 213 and a first circuit area 216 on the first semiconductor substrate 213. The first circuit area 216 may include a first circuit device 221 on the first semiconductor substrate 213, and first bonding pads 231 that may be electrically connected to the first circuit device 221.

The second structure 235 may include an intermediate structure 240, a bonding structure 270 between the intermediate structure 240 and the first structure 210, and a back side structure 285 on the intermediate structure 240. The intermediate structure 240 may be disposed between the back side structure 285 and the bonding structure 270.

The intermediate structure 240 includes a plurality of semiconductor chips 243a and 243b spaced apart from each other in a horizontal direction, a semiconductor pattern 262 surrounding the plurality of semiconductor chips 243a and 243b, and an insulating gap fill pattern 265 between the plurality of semiconductor chips 243a and 243b and the semiconductor pattern 262.

The plurality of semiconductor chips 243a and 243b may include a second semiconductor chip 243a and a third semiconductor chip 243b spaced apart from each other in a horizontal direction, on the first structure, for example, the first semiconductor chip 210.

Each of the plurality of semiconductor chips 243a and 243b may include a second semiconductor substrate 245, a second circuit area 251, and a protective insulating layer 259. The second circuit area 251 may be disposed between the protective insulating layer 259 and the second semiconductor substrate 245. The second circuit area 251 may include a second circuit device 247. The protective insulating layer 259 may contact the bonding structure 270.

The semiconductor pattern 262 may be disposed to surround a side surface of each of the plurality of semiconductor chips 243a and 243b. For example, the semiconductor pattern 262 may include quadrangular ring-shaped portions 262a and 262b having side surfaces aligned with the side surface of the first structure 210, for example, the first semiconductor chip 210, and an intermediate portion 262c extending between the plurality of semiconductor chips 243a and 243b from the ring-shaped portions 262a and 262b. The semiconductor pattern 262 may be formed of a silicon material. A portion of the semiconductor pattern 262 located at the same height level as the plurality of semiconductor chips 243a and 243b may not include a semiconductor integrated circuit.

In an example, the thickness of the semiconductor pattern 262 may be greater than the thickness of the second semiconductor substrate 245 of the plurality of semiconductor chips 243a and 243b.

The insulating gap fill pattern 265 may include an insulating material such as silicon oxide. The insulating gap fill pattern 265 includes a first portion 264a disposed between the semiconductor pattern 262 and the plurality of semiconductor chips 243a and 243b, and a second portion 264b disposed between the semiconductor pattern 262 and the bonding structure 270.

The bonding structure 270 may include an insulating layer 276, an intermediate connection wiring 272 within the insulating layer 276 that may be electrically connected to the second circuit device 247, and second bonding pads 278 that may be electrically connected to the intermediate connection wiring 272, in the insulating layer 276. The second bonding pads 278 may be bonded while contacting the first bonding pads 231 of the first structure 210. The first bonding pads 231 and the second bonding pads 278 may include the same metal material. For example, the first bonding pads 231 and the second bonding pads 278 may include a copper material.

The second structure 235 may further include through-electrode structures 295a and 295b. Similar to FIG. 7, the through-electrode structures 295a and 295b may include first through-electrode structures 295a penetrating through the second and third semiconductor chips 243a and 243b and extending into the bonding structure 270, and second through-electrode structures 295b penetrating through the semiconductor pattern 262 and extending into the bonding structure 270.

In an example, among the through-electrode structures 295a and 295b, the first through-electrode structures 295a may be omitted. In another example, among the through-electrode structures 295a and 295b, the second through-electrode structures 295b may be omitted. In this case, the first through-electrode structures 295a may be formed similarly to the through-electrode structures 95 of FIGS. 1B and 1C. For example, the first through-electrode structures 295a may penetrate through the second semiconductor substrate 245 of the second and third semiconductor chips 243a and 243b and extend into the second circuit area 251.

The back side structure 285 may include a back side insulating layer 287, back side conductive patterns 289 on the back side insulating layer 287, and a capping insulating layer 291 having openings 291a exposing pad regions 289p of the back side conductive patterns 289, on the back side conductive patterns 289. The back side insulating layer 287 may include an insulating material such as silicon oxide. The back side conductive patterns 289 may include a metal material such as copper or aluminum. The capping insulating layer 291 may include a material such as silicon nitride or polyimide. The through-electrode structures 295a and 295b may penetrate through the back side insulating layer 287 and may be electrically connected to the back side conductive patterns 289.

In another example, the back side structure 285 may be replaced by the back side structure (185 in FIG. 9) including the first back side device 183a as in FIG. 9, or the back side structure (185 of FIG. 10) including the first back side device 183a and the second back side device 183b as in FIG. 10.

Figure 12:
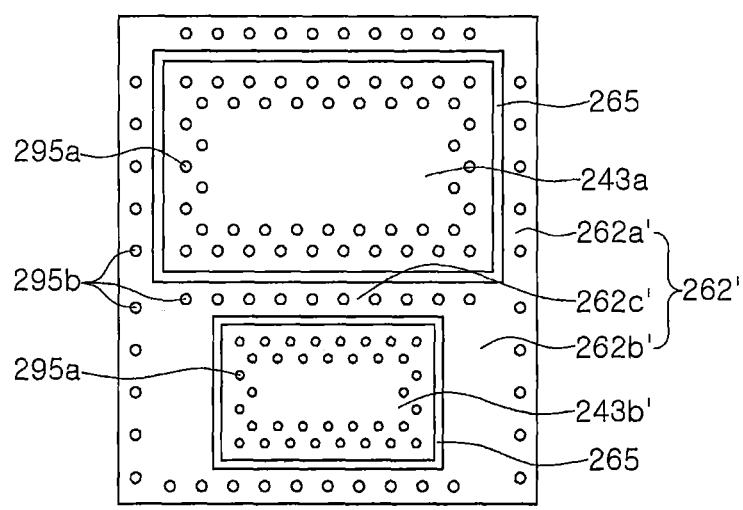
FIG. 12 is a schematic plan view illustrating a modified example of a stacked chip structure of a semiconductor package according to an example embodiment of the inventive concepts.

Next, a modified example of the plurality of semiconductor chips 243a and 243b will be described with reference to FIG. 12. FIG. 12 is a plan view illustrating a modified example of the size of the plurality of semiconductor chips 243a and 243b in the plan view of FIG. 11A.

In a modified example, referring to FIG. 12, at least two of the plurality of semiconductor chips 243a and 243b' may have different sizes. For example, the plurality of semiconductor chips 243a and 243b' may include a second semiconductor chip 243a and a third semiconductor chip 243b' having a smaller width or a smaller planar size than the second semiconductor chip 243a.

The semiconductor pattern 262' surrounding the plurality of semiconductor chips 243a and 243b' may include ring-shaped portions 262a' and 262b' forming a ring shape, and an intermediate portion 262c' extending between the second semiconductor chip 243a and the third semiconductor chip 243b' from the ring-shaped portions 262a' and 262b'.

Figure 13:
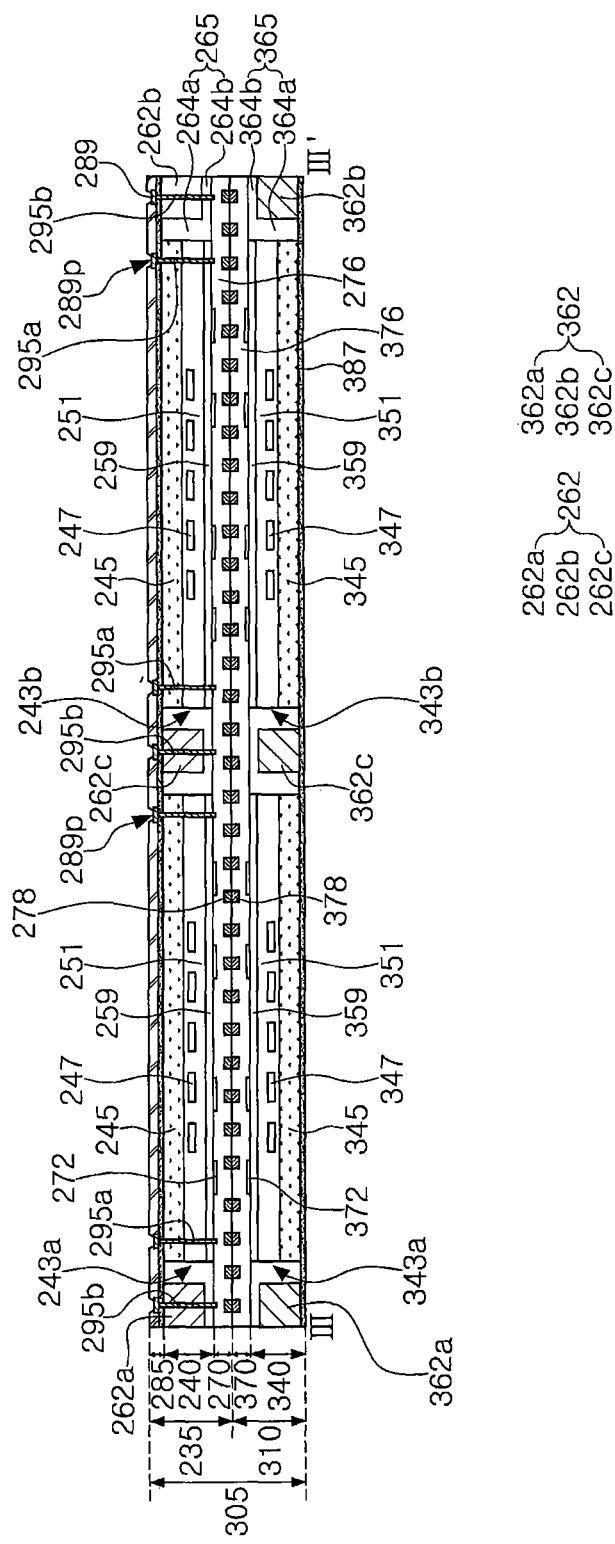
FIG. 13 is a schematic cross-sectional view illustrating a modified example of a stacked chip structure of a semiconductor package according to an example embodiment of the inventive concepts.

Next, a modified example of the first structure 210 in FIG. 11B will be described with reference to FIG. 13. FIG. 13 is a cross-sectional view illustrating a modified example of the first structure 210 in FIG. 11B.

In a modified example, referring to FIG. 13, a stacked chip structure 305 of a semiconductor package according to an example embodiment may include a first structure 310 that may replace the first structure 210 in FIG. 11B, and a second structure 235 as described with reference to FIG. 11B.

The first structure 310 may include a plurality of lower semiconductor chips 343a and 343b, a lower semiconductor pattern 362, a lower insulating gap fill pattern 365, and a lower bonding structure 370.

The lower semiconductor chips 343a and 343b may include a first lower semiconductor chip 343a and a second lower semiconductor chip 343b spaced apart from each other in a horizontal direction.

The lower semiconductor pattern 362 may have a shape adjacent and/or surrounding the respective lower semiconductor chips 343a and 343b. For example, the lower semiconductor pattern 362 may have the same or similar shape as the semiconductor pattern 262 of the second structure 235. For example, the lower semiconductor pattern 362 may include ring-shaped ring portions 362a and 362b, and an intermediate portion 362c extending between the lower semiconductor chips 343a and 343b from the ring portions 362a and 362b.

The lower insulating gap fill pattern 365 may include a first portion 364a disposed between (e.g., in the horizontal direction) the lower semiconductor pattern 362 and the lower semiconductor chips 343a and 343b, and a second portion 364b disposed between (e.g., in the vertical direction) the lower semiconductor pattern 362 and the lower bonding structure 370.

Each of the lower semiconductor chips 343a and 343b may include a lower semiconductor substrate 345, a lower circuit area 351, and a lower protective insulating layer 359. The lower circuit area 351 may be disposed between the protective insulating layer 359 and the lower semiconductor substrate 345. In each of the lower semiconductor chips 343a and 343b, the lower circuit area 351 may be disposed between the lower semiconductor substrate 345 and the lower bonding structure 370, and may include a lower circuit device 347. The lower protective insulating layer 359 may contact the lower bonding structure 370.

The first structure 310 may further include a lower insulating layer 387 on and/or covering lower surfaces of the plurality of lower semiconductor chips 343a and 343b, the lower semiconductor pattern 362, and the lower insulating gap fill pattern 365.

The lower bonding structure 370 may include a lower insulating layer 376, a lower intermediate connection wiring 372 that may be electrically connected to the lower circuit device 347 in the lower insulating layer 376, and first bonding pads 378 that may be electrically connected to the lower intermediate connection wiring 372 in the lower insulating layer 376. The first bonding pads 378 may be bonded while contacting the second bonding pads 278 of the second structure 235.

Figure 14:
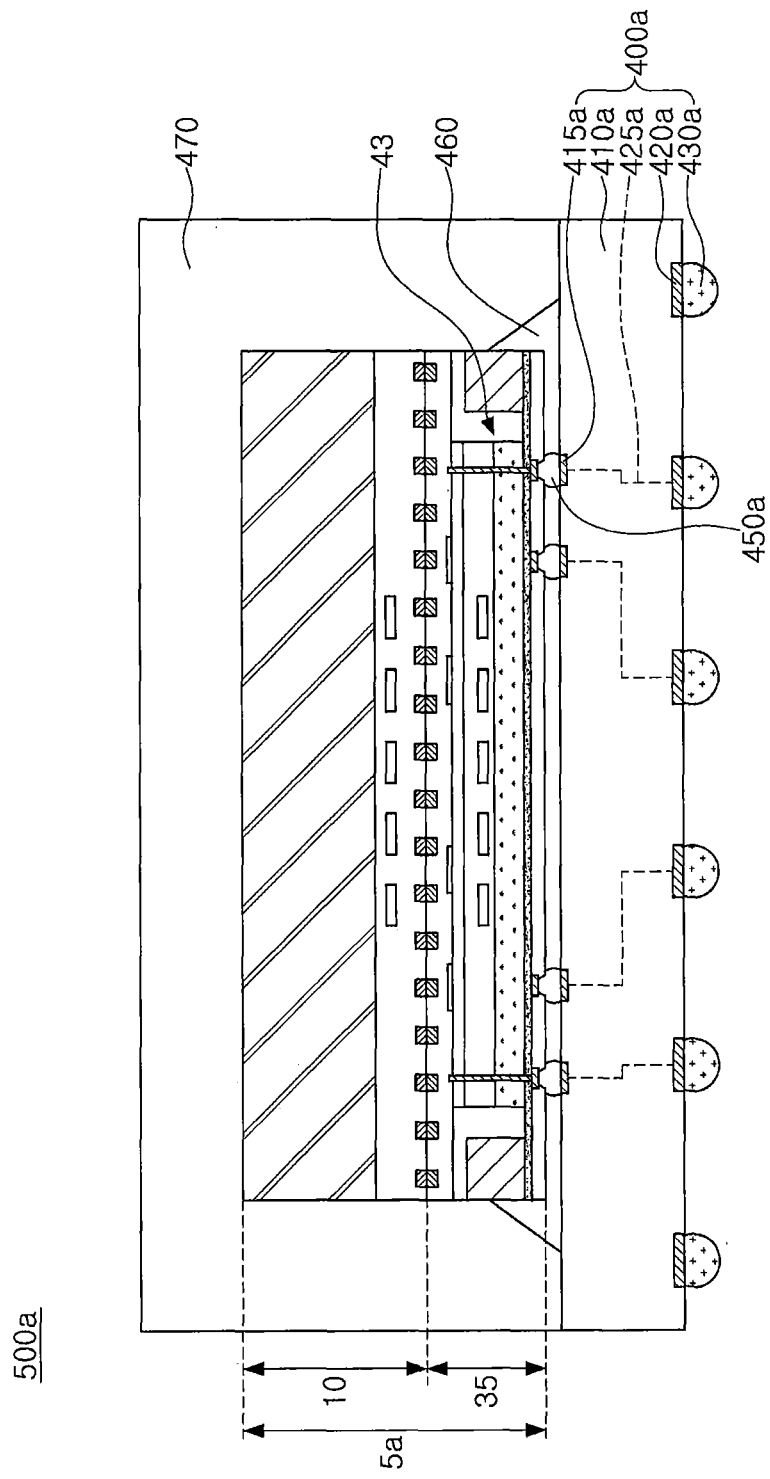
FIG. 14 is a schematic cross-sectional view illustrating an example of a semiconductor package according to an example embodiment of the inventive concepts.
Figure 15:
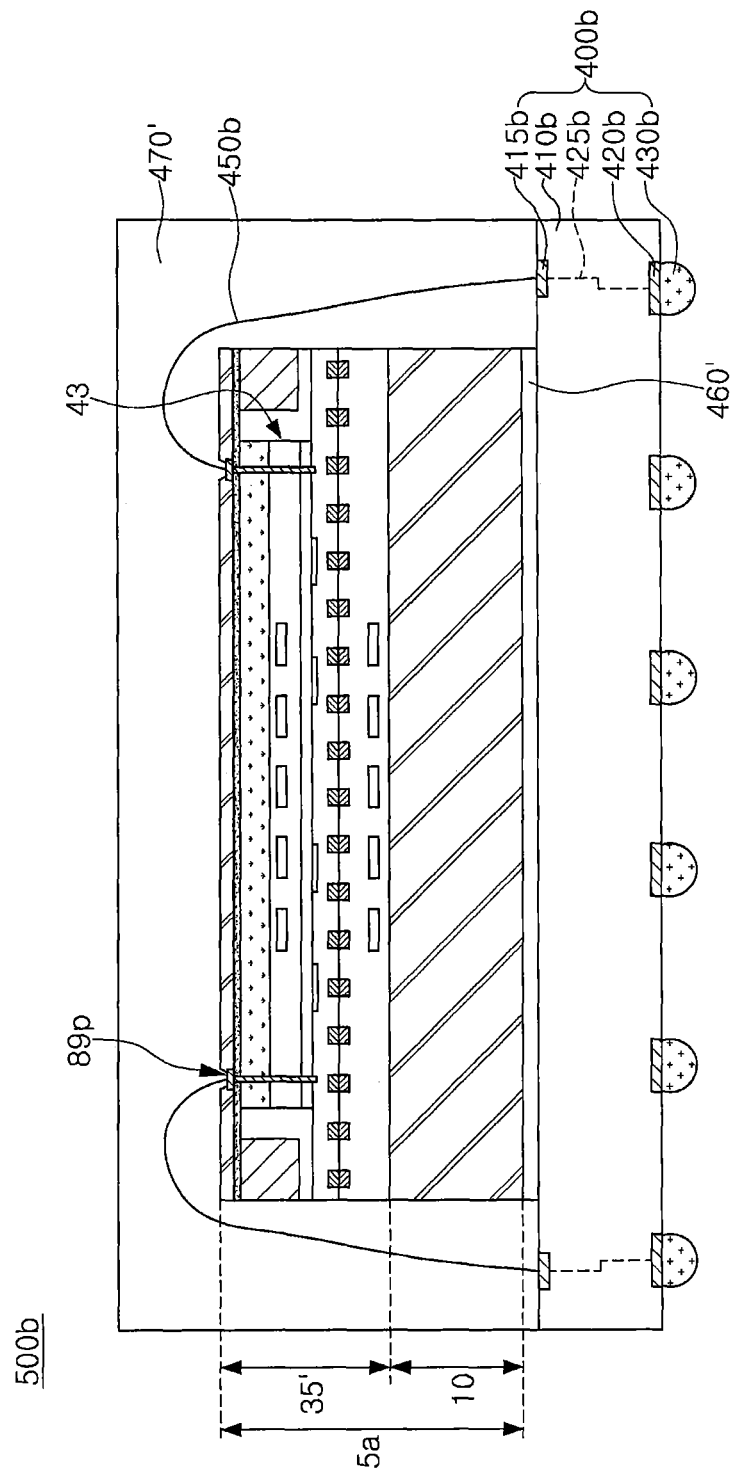
FIG. 15 is a schematic cross-sectional view of another example of a semiconductor package according to an example embodiment of the inventive concepts.
Figure 16:
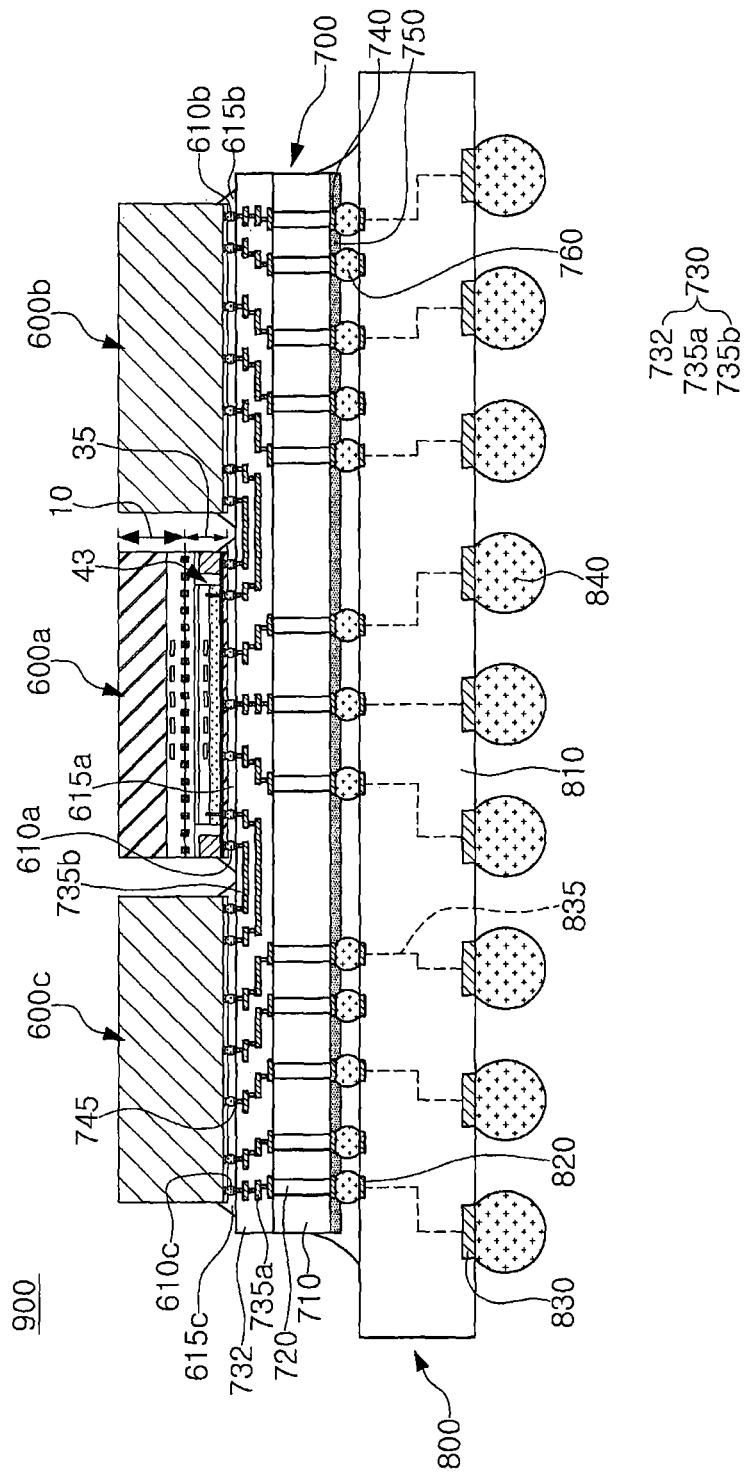
FIG. 16 is a schematic cross-sectional view of another example of a semiconductor package according to an example embodiment of the inventive concepts.

Next, with reference to FIGS. 14, 15 and 16, various examples of the semiconductor package including any one of the stacked chip structures 5, 5a, 5b, 5a', 5b', 205, and 305 described above with reference to FIGS. 1A to 13 will be described. FIGS. 14, 15, and 16 are cross-sectional views illustrating a semiconductor package including a stacked chip structure according to an example embodiment of the inventive concepts.

First, various examples of a semiconductor package including any one of the stacked chip structures 5, 5a, 5b, 5a', 5b', 205, and 305 described above with reference to FIGS. 1A to 13 will be described with reference to FIG. 14.

In an example, referring to FIG. 14, a semiconductor package 500a according to an example embodiment may include a substrate 400a, and any one of the stacked chip structures 5, 5a, 5b, 5a', 5b', 205, and 305 described above with reference to FIGS. 1A to 13, mounted on the substrate 400a. For example, the stacked chip structure 5a described with reference to FIGS. 4A and 4B may be mounted on the substrate 400a.

The second structure 35 of the stacked chip structure 5a may face the substrate 400a.

The semiconductor package 500a may further include conductive bumps 450a electrically connecting the substrate 400a and the stacked chip structure 5a, an underfill material layer 460 filling between the substrate 400a and the stacked chip structure 5a and surrounding side surfaces of the conductive bumps 450a, and a mold layer 470 on and/or covering the stacked chip structure 5a, on the substrate 400a.

In an example, the substrate 400a may be a package substrate such as a printed circuit board. The substrate 400a is not limited to a printed circuit board, and may be in various forms, for example, a package substrate such as a redistribution substrate. For example, the substrate 400a may include a package body 410a, upper pads 415a disposed in an upper portion of the package body 410a and electrically connected to the conductive bumps 450a, lower pads 420a disposed in a lower portion of the package body 410a, an internal wiring 425a electrically connecting the upper pads 415a and the lower pads 420a in the package body 410a, and lower solder balls 430a disposed below the lower pads 420a to be in contact with the lower pads 420a.

In an example, the mold layer 470 may include an epoxy-group molding resin or a polyimide-group molding resin. For example, the mold layer 470 may include an epoxy molding compound (EMC) or a High-K epoxy molding compound.

In another example, referring to FIG. 15, a semiconductor package 500b according to an example embodiment may include a substrate 400b, and any one of the stacked chip structures 5, 5a, 5b, 5a', 5b', 205, and 305 described above with reference to FIGS. 1A to 13, mounted on the substrate 400b by wire bonding. For example, the stacked chip structure 5a described with reference to FIGS. 4A and 4B may be mounted on the substrate 400b, for example, a package substrate.

The first structure 10 of the stacked chip structure 5a may face the substrate 400b.

The semiconductor package 500b may further include bonding wires 450b electrically connecting the substrate 400b and the stacked chip structure 5a, and an adhesive layer 460' between the substrate 400b and the stacked chip structure 5a, and a mold layer 470' on and/or covering the stacked chip structure 5a and the bonding wires 450b, on the substrate 400b.

In an example, the substrate 400b may be a package substrate such as a printed circuit board or a redistribution board. For example, the substrate 400b may include a package body 410b, upper pads 415b disposed in an upper portion of the package body 410b and electrically connected to the bonding wires 450b, lower pads 420b disposed in a lower portion of the package body 410b, an internal wiring 425b electrically connecting the upper pads 415b and the lower pads 420b inside of the package body 410b, and lower solder balls 430b disposed below the lower pads 420b to be in contact with the lower pads 420b.

In an example, the bonding wires 450b may electrically connect pad regions 89p of the second structure 35 of the stacked chip structure 5a and the upper pads 415b of the substrate 400b.

In another example, referring to FIG. 16, a semiconductor package 900 according to an example embodiment may include a package substrate 800, a connection substrate 700 on the package substrate 800, a stacked chip structure 600a disposed on the connection substrate 700, and one or a plurality of semiconductor chip structures 600b and 600c spaced apart from the stacked chip structure 600a horizontally, on the connection substrate 700. The stacked chip structure 600a may be the same as or similar to any one of the stacked chip structures 5, 5a, 5b, 5a', 5b', 205, and 305 described above with reference to FIGS. 1A to 13.

The stacked chip structure 600a may include a first structure 10 and a second structure 35 stacked on each other, and the second structure 35 may be disposed between the first structure 10 and the connection substrate 700.

The semiconductor package 900 may further include intermediate connection conductive bumps 760 disposed between the package substrate 800 and the connection substrate 700 to electrically connect the package substrate 800 and the connection substrate 700, first connection conductive bumps 610a disposed between the connection substrate 700 and the stacked chip structure 600a to electrically connect the connection substrate 700 and the stacked chip structure 600a, and second connection conductive bumps 610b and 610c disposed between the connection substrate 700 and the one or the plurality of semiconductor chip structures 600b and 600c to electrically connect the connection substrate 700 and the one or the plurality of semiconductor chip structures 600b and 600c.

The semiconductor package 900 may further include a first underfill material layer 615a between the connection substrate 700 and the stacked chip structure 600a and surrounding side surfaces of the first connection conductive bumps 610a, and second underfill material layers 615b and 615c between the connection substrate 700 and the one or the plurality of semiconductor chip structures 600b and 600c and surrounding side surfaces of the second connection conductive bumps 610b and 610c.

The package substrate 800 may include a package body 810, upper pads 820 disposed in an upper portion of the package body 810 and electrically connected to the connection conductive bumps 760, lower pads 830 disposed in a lower portion of the package body 810, an internal wiring 835 electrically connecting the upper pads 820 and the lower pads 830 within the package body 810, and lower solder balls 840 disposed below the lower pads 830 to contact the lower pads 830.

The connection substrate 700 may be an interposer substrate or a redistribution substrate. The interposer substrate 700 may include a semiconductor substrate 710, a through via 720, a wiring region 730, and a passivation layer 750.

The connection substrate 700 may include lower pads 740 disposed on the lower surface of the connection substrate 700 and electrically connected to and in contact with the connection conductive bumps 760, and upper pads 745 disposed on the upper surface of the connection substrate 700 and electrically connected to and in contact with the first and second connection conductive bumps 610a, 610b and 610c.

The semiconductor substrate 710 may be formed of a semiconductor material such as silicon.

The through vias 720 may be through-silicon vias (TSVs) penetrating through the semiconductor substrate 710 in a vertical direction. For example, each of the through vias 720 may include a conductive via pattern penetrating through the semiconductor substrate 710 in a vertical direction and an insulating via spacer surrounding a side surface of the conductive via pattern.

The wiring region 730 may be disposed on the semiconductor substrate 710. The wiring region 730 may include an insulating layer 732, and connection wires 735a and 735b buried in the insulating layer 732.

In the connection substrate 700, the connection wires 735a and 735b may include first connection wires 735a and second connection wires 735b.

The first connection wires 735a may electrically connect some of the upper pads 745 to the through vias 720. The second connection wires 735b may electrically connect some of the upper pads 745 electrically connected to the stacked chip structure 600a to some of the upper pads 745 electrically connected to the one or plurality of semiconductor chip structures 600b and 600c, to electrically connect the stacked chip structure 600a to the one or plurality of semiconductor chip structures 600b and 600c. The passivation layer 750 may be disposed on a bottom surface or a back side of the connection substrate 700.

In an example, the stacked chip structure 600a may include a plurality of semiconductor chips, as described in FIGS. 1A to 13, and at least one of the plurality of semiconductor chips of the stacked chip structure 600a may include a logic chip such as central processing unit (CPU), graphics processing unit (GPU), field programmable gate array (FPGA), digital signal processor (DSP), cryptographic processor, microprocessor, microcontroller, analog-to-digital converter, or an application-specific IC (ASIC). For example, in the stacked chip structure 600a, the first semiconductor chip of the first structure 10 may be a processor chip, and the second semiconductor chip of the second structure 35 may be an analog chip.

In an example, at least one of the one or plurality of semiconductor chip structures 600b and 600c may include a volatile memory device such as dynamic RAM (DRAM) or static RAM (SRAM), a nonvolatile memory device such as a phase change RAM (PRAM), a magnetic RAM (MRAM), a resistive RAM (RRAM), or a flash memory device, or a high-performance memory device such as a high bandwidth memory (HBM) or a hybrid memory cubic (HMC).

Next, an example of a method of manufacturing a semiconductor package according to an example embodiment will be described with reference to FIGS. 17A to 19.

Figure 17A:
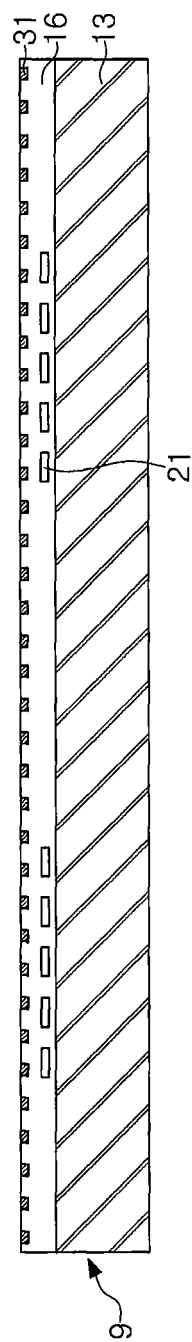
FIGS. 17A to 19 are cross-sectional views schematically illustrating a method of manufacturing a stacked chip structure of a semiconductor package according to an example embodiment of the inventive concepts.

Referring to FIG. 17A, a first semiconductor wafer 9 may be formed. Forming the first semiconductor wafer 9 may include forming first circuit areas 16 including first circuit devices 21 on a first semiconductor substrate 13, and forming first bonding pads 31 buried in the surfaces of the first circuit areas 16.

Figure 17B:
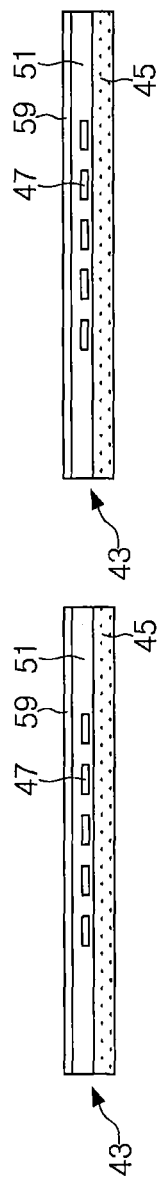

Referring to FIG. 17B, a plurality of semiconductor chips 43 may be formed. Forming the plurality of semiconductor chips 43 may include forming a second semiconductor wafer and dividing the second semiconductor wafer into a plurality of semiconductor chips 43 by performing a sawing process. Forming the second semiconductor wafer may include forming second circuit areas 51 including second circuit devices 47 on a second semiconductor substrate 45, and forming a protective insulating layer 59 on the second circuit areas 51 to protect the second circuit areas 51. Accordingly, each of the plurality of semiconductor chips 43 may include the second semiconductor substrate 45, the second circuit area 51, and the protective insulating layer 59.

Figure 18A:
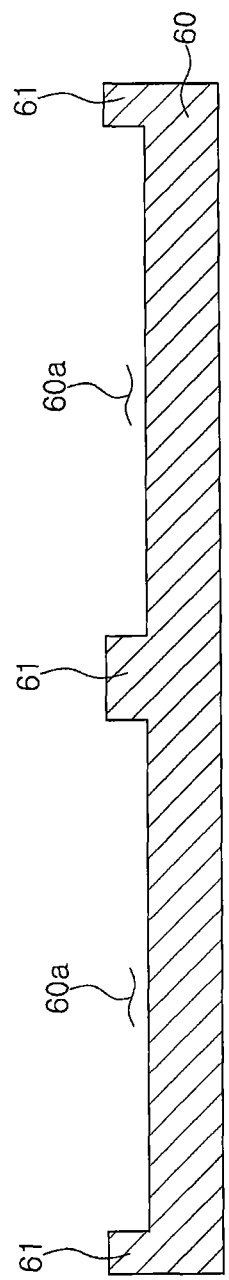

Referring to FIG. 18A, a carrier substrate 60 may be formed. Forming the carrier substrate 60 may include preparing a semiconductor substrate and partially etching the surface of the semiconductor substrate to form a plurality of recess regions 60a spaced apart from each other. Portions of the semiconductor substrate surrounding the plurality of recess regions 60a may be defined as protrusions 61. The carrier substrate 60 may be a silicon substrate.

Figure 18B:
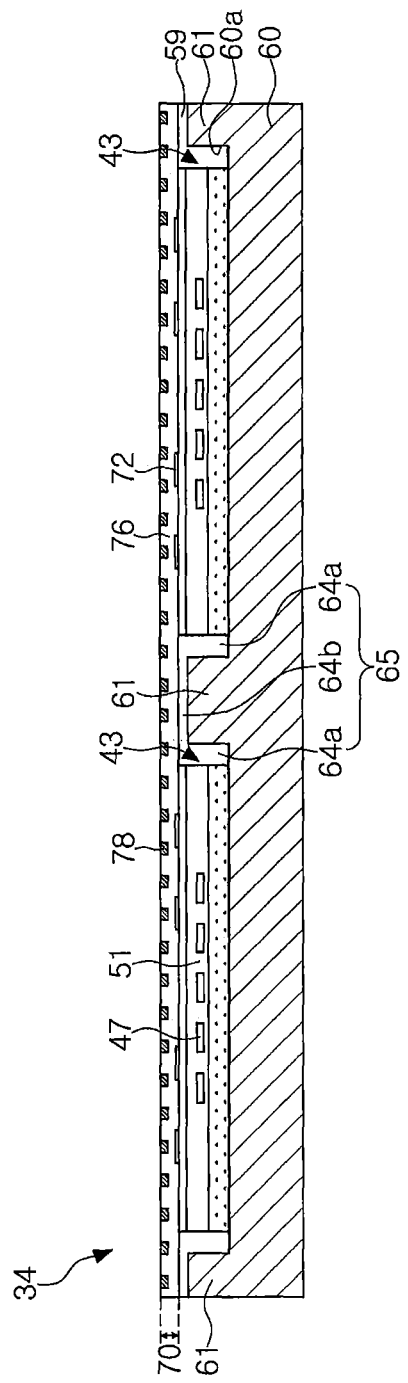

Referring to FIG. 18B, the plurality of semiconductor chips 43 may be inserted into the recess regions 60a of the carrier substrate 60, respectively, and an insulating gap fill pattern 65 may be formed to fill between the protrusions 61 and the plurality of semiconductor chips 43 and be on and/or cover the plurality of semiconductor chips 43 and the protrusions 61.

In an example, a planarization process may be performed to planarize the insulating gap fill pattern 65 until the upper surfaces of the plurality of semiconductor chips 43 are exposed. In the plurality of semiconductor chips 43, the protective insulating layer 59 may protect the second circuit area 51 from the planarization process. The planarization process may be a chemical mechanical polishing (CMP) process.

In an example, in the case in which the thickness of the plurality of semiconductor chips 43 is greater than the depth of the recess regions 60a, a portion of the insulating gap fill pattern 65 may remain on the protrusions 61. Accordingly, the insulating gap fill pattern 65 may include a first portion 64a between the protrusions 61 and the plurality of semiconductor chips 43, and a second portion 64b on and/or covering the upper surfaces of the protrusions 61.

Subsequently, the bonding structure 70 may be formed. The bonding structure 70 may include an intermediate connection wiring 72 electrically connected to the second circuit device 47 of the second circuit area 51 of the plurality of semiconductor chips 43, an insulating layer 76 covering the intermediate connection wiring 72, and second bonding pads 78 buried in the insulating layer 76 and having an upper surface coplanar with the upper surface of the insulating layer 76.

Accordingly, a second semiconductor wafer 34 including the carrier substrate 60, the plurality of semiconductor chips 43, the insulating gap fill pattern 65, and the bonding structure 70 may be formed.

Figure 18C:
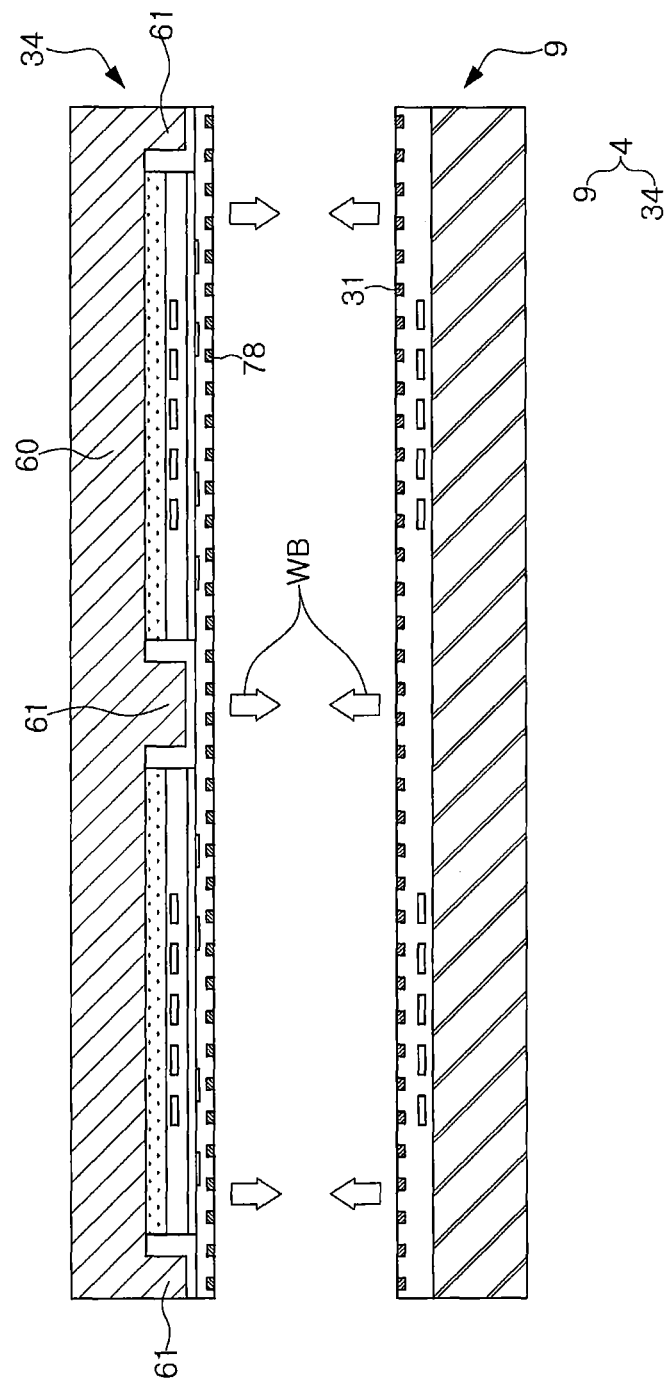

Referring to FIG. 18C, a wafer bonding process (WB) may be performed to bond the first semiconductor wafer 9 and the second semiconductor wafer 34 to form a preliminary bonding wafer 4. For example, by the wafer bonding process (WB), the first bonding pads 31 of the first semiconductor wafer 9 and the second bonding pads 78 of the second semiconductor wafer 34 may be bonded while contacting each other. The first and second bonding pads 31 and 78 may be formed of a copper material. Accordingly, the preliminary bonding wafer 4 in which the first semiconductor wafer 9 and the second semiconductor wafer 34 are bonded may be formed.

Figure 18D:
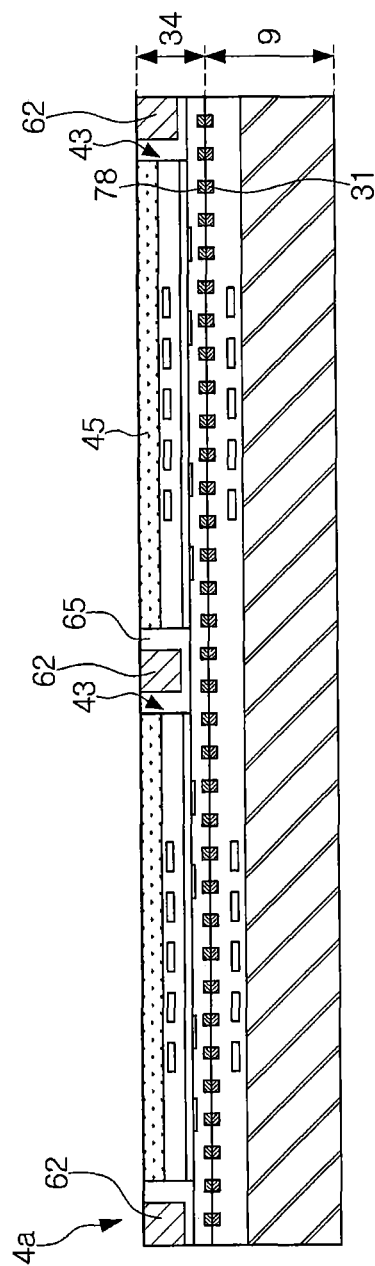

Referring to FIG. 18D, a thickness reduction process of reducing the thickness of the preliminary bonding wafer 4 may be performed to form a bonding wafer 4a having a reduced thickness. For example, a portion in which the carrier substrate 60 is provided may be removed from the preliminary bonding wafer 4 by a grinding process or polishing process, and the thickness of the semiconductor substrate 45 of the plurality of semiconductor chips 43 may be reduced, thereby forming the bonding wafer 4a. In this case, the protrusions of the carrier substrate 60 remain, and may be formed as a semiconductor pattern 62.

The surface of the semiconductor pattern 62 and the surface of the semiconductor substrate 45 of the plurality of semiconductor chips 43 may form a coplanar surface.

Figure 19:
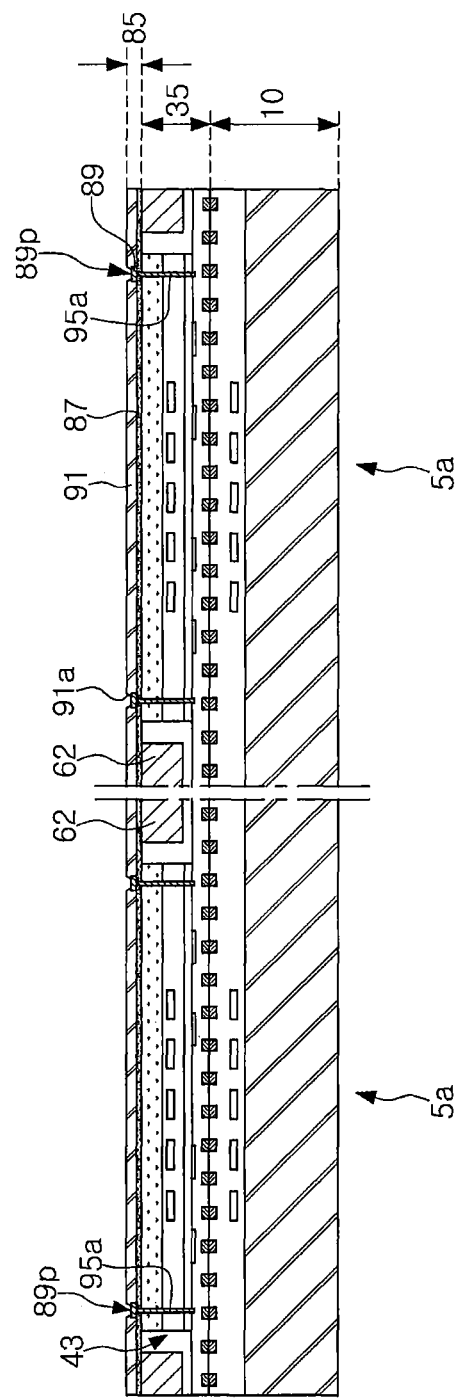

Referring to FIG. 19, a back side structure 85 and through-electrode structures 95 may be formed. For example, the formation of the back side structure 85 and the through-electrode structures 95 may include forming a back side insulating layer 87 on and/or covering the surface of the semiconductor pattern 62 of the bonding wafer 4a and the surface of the semiconductor substrate 45 of the plurality of semiconductor chips 43, forming through-electrode structures 95a penetrating through the back side insulating layer 87 and extending into the bonding wafer 4a, forming back side conductive patterns 89 electrically connected to the through-electrode structures 95a, on the back side insulating layer 87, forming a capping insulating layer 91 covering the back side conductive patterns 89 on the back side insulating layer 87, and patterning the capping insulating layer 91 to form openings 91a exposing pad regions 89p of the back side conductive patterns 89.

Subsequently, by performing a sawing process, the back side structure 85 and the bonding wafer 4a are cut to form a plurality of stacked chip structures 5a.

According to an example embodiment, an electronic apparatus or an electronic system including a semiconductor package including any one of the stacked chip structures described in FIGS. 1A to 13 may be provided.

As set forth above, according to example embodiments of the inventive concepts, by forming a plurality of semiconductor chips, burying a plurality of semiconductor chips of a carrier semiconductor wafer, and performing a wafer bonding process of bonding the carrier semiconductor wafer in which the plurality of semiconductor chips are buried and a semiconductor wafer are formed by a separate semiconductor process to form one bonding wafer, the bonding wafer may be cut through a sawing process to form stacked chip structures including semiconductor chips stacked in a vertical direction. In the case of the stacked chip structure formed as described above, the size or volume may be reduced while having improved reliability of the stacked chip structure. Accordingly, the volume of a semiconductor package on which such a stacked chip structure is mounted may be reduced, and further, reliability of the semiconductor package may be improved.

While example embodiments of the inventive concepts have been illustrated and described above, it will be apparent to those skilled in the art that modifications and variations could be made without departing from the scope of the present inventive concepts as defined by the appended claims.

What is claimed is:

1. A semiconductor package, comprising:
   a first structure comprising a first semiconductor chip comprising a first semiconductor integrated circuit; and
   a second structure on the first structure,
   wherein the second structure comprises a second semiconductor chip comprising a second semiconductor integrated circuit, a semiconductor pattern horizontally spaced apart from the second semiconductor chip and on a side surface of the second semiconductor chip, an insulating gap fill pattern between the second semiconductor chip and the semiconductor pattern, and through-electrode structures,
   wherein at least one of the through-electrode structures penetrates through at least a portion of the second semiconductor chip or penetrates through the semiconductor pattern, and wherein the semiconductor pattern is free of a semiconductor integrated circuit at a same height level as the second semiconductor integrated circuit of the second semiconductor chip.

2. The semiconductor package of claim 1, wherein the semiconductor pattern comprises a silicon material, and
   wherein the semiconductor pattern comprises an outer side surface vertically aligned with a side surface of the first semiconductor chip, and
   wherein the semiconductor pattern at least partially surrounds the second semiconductor chip in a plan view.

3. The semiconductor package of claim 1, wherein the second structure further comprises a capping structure,
   wherein the capping structure is on the semiconductor pattern, the second semiconductor chip, and the insulating gap fill pattern,
   wherein the semiconductor pattern, the second semiconductor chip, and the insulating gap fill pattern are between the capping structure and the first structure,
   wherein the capping structure comprises a first capping insulating layer, redistribution conductive patterns on the first capping insulating layer, and a second capping insulating layer on the redistribution conductive patterns, the second capping insulating layer exposing pad regions of the redistribution conductive patterns, wherein the at least one of the through-electrode structures extends into the capping structure to penetrate through the first capping insulating layer, and wherein the through-electrode structures comprise through-electrodes electrically connected to the redistribution conductive patterns.

4. The semiconductor package of claim 3, further comprising:
a package substrate; and
conductive bumps,
wherein the conductive bumps are between a stacked chip structure and the package substrate and electrically connect the stacked chip structure and the package substrate to each other,
wherein the stacked chip structure comprises the first structure and the second structure, and
wherein the second structure is between the first structure and the package substrate.

5. The semiconductor package of claim 3, further comprising:
a package substrate; and
bonding wires,
wherein a stacked chip structure comprising the first structure and the second structure is on the package substrate, and
wherein the first structure is between the second structure and the package substrate.

6. The semiconductor package of claim 3, further comprising:
a package substrate;
a connection substrate on the package substrate;
connection conductive bumps on the connection substrate; and
one or more semiconductor chip structures on the connection substrate,
wherein a stacked chip structure comprising the first structure and the second structure is on the connection substrate and is horizontally spaced apart from the one or more semiconductor chip structures,
wherein the connection conductive bumps are between the connection substrate and the one or more semiconductor chip structures, and between the connection substrate and the stacked chip structure, and
wherein the second structure is between the first structure and the connection substrate.

7. The semiconductor package of claim 3, wherein the capping structure further comprises a back side device,
wherein the back side device overlaps at least one of the second semiconductor chip and the semiconductor pattern in a vertical direction.

8. The semiconductor package of claim 7, wherein the back side device comprises an active device, a passive device, an image sensor, an optical connection unit, an analog device, and/or a memory device.

9. The semiconductor package of claim 1, wherein the first semiconductor chip comprises a first semiconductor substrate and a first circuit area,
wherein the second semiconductor chip comprises a second semiconductor substrate and a second circuit area,
wherein the first circuit area comprises a first circuit device, a first circuit wiring electrically connected to the first circuit device, and first bonding pads electrically connected to the first circuit wiring,
wherein the second circuit area comprises a second circuit device and a second circuit wiring electrically connected to the second circuit device,
wherein the first semiconductor integrated circuit comprises the first circuit device, and
wherein the second semiconductor integrated circuit comprises the second circuit device.

10. The semiconductor package of claim 9, wherein the second structure further comprises a bonding structure,
wherein the bonding structure comprises:
a first portion between the first semiconductor chip and the second semiconductor chip;
a second portion between the first semiconductor chip and the semiconductor pattern;
an intermediate connection wiring electrically connected to the second circuit wiring; and
second bonding pads electrically connected to the intermediate connection wiring, and
wherein the first bonding pads and the second bonding pads contact each other.

11. The semiconductor package of claim 10, wherein the at least one of the through-electrode structures penetrates through at least the second semiconductor substrate of the second semiconductor chip, and is electrically connected to the intermediate connection wiring and/or the second circuit wiring.

12. The semiconductor package of claim 10, wherein the at least one of the through-electrode structures penetrates through the semiconductor pattern and is electrically connected to the intermediate connection wiring.

13. The semiconductor package of claim 1, wherein the first structure further comprises:
a lower semiconductor chip horizontally spaced apart from the first semiconductor chip; and
a lower semiconductor pattern on side surfaces of the first semiconductor chip and the lower semiconductor chip.

14. The semiconductor package of claim 1, wherein the second structure further comprises an upper semiconductor chip horizontally spaced apart from the second semiconductor chip,
wherein the semiconductor pattern is on side surfaces of the second semiconductor chip and the upper semiconductor chip.

15. A semiconductor package, comprising:
a first structure comprising a first semiconductor chip; and
a second structure on the first structure,
wherein the second structure comprises a bonding structure bonded to the first semiconductor chip, a second semiconductor chip on the bonding structure, a semiconductor pattern on the bonding structure and horizontally spaced apart from the second semiconductor chip, and an insulating gap fill pattern between the second semiconductor chip and the semiconductor pattern,
wherein the first semiconductor chip comprises a first semiconductor substrate and a first circuit area,
wherein the second semiconductor chip comprises a second semiconductor substrate and a second circuit area,
wherein the first circuit area and the second circuit area are between the first semiconductor substrate and the second semiconductor substrate, and
wherein the semiconductor pattern at least partially surrounds the second semiconductor chip in a plan view.

16. The semiconductor package of claim 15, wherein the semiconductor pattern comprises a silicon material at a same height level with respect to an upper surface of the first semiconductor substrate as the second circuit area, and is free of a semiconductor integrated circuit at the same height level as the second circuit area.

17. The semiconductor package of claim 15, further comprising through-electrode structures,
wherein at least one of the through-electrode structures penetrates at least a portion of the second semiconductor chip or penetrates through the semiconductor pattern,
wherein the first circuit area comprises a first circuit device, a first circuit wiring electrically connected to the first circuit device, and first bonding pads electrically connected to the first circuit wiring,
wherein the second circuit area comprises a second circuit device and a second circuit wiring electrically connected to the second circuit device,
wherein the bonding structure comprises an intermediate connection wiring electrically connected to the second circuit wiring and second bonding pads electrically connected to the intermediate connection wiring,
wherein the first bonding pads and the second bonding pads are in contact with each other, and
wherein the first and second bonding pads comprise a copper material.

18. A semiconductor package, comprising:
a first semiconductor chip;
a second semiconductor chip on the first semiconductor chip;
a semiconductor pattern on the first semiconductor chip and horizontally spaced apart from the second semiconductor chip, the semiconductor pattern at least partially surrounding the second semiconductor chip in a plan view; and
an insulating gap fill pattern between the second semiconductor chip and the semiconductor pattern,
wherein a distance between the semiconductor pattern and the second semiconductor chip is about 0.5 μm to about 10 μm,
wherein a thickness of the second semiconductor chip is about 3 μm to about 10 μm,
wherein a thickness of the first semiconductor chip is greater than the distance between the semiconductor pattern and the second semiconductor chip,
wherein the thickness of the first semiconductor chip is greater than a thickness of the semiconductor pattern, and
wherein the thickness of the first semiconductor chip is greater than the thickness of the second semiconductor chip.

19. The semiconductor package of claim 18, wherein the distance between the semiconductor pattern and the second semiconductor chip is about 2.5 μm to about 3.5 μm.

20. The semiconductor package of claim 18, further comprising:
a bonding structure; and
through-electrode structures,
wherein the bonding structure comprises a first portion between the first semiconductor chip and the second semiconductor chip and a second portion interposed between the first semiconductor chip and the semiconductor pattern,
wherein the first semiconductor chip comprises a first semiconductor substrate and a first circuit area between the first semiconductor substrate and the bonding structure,
wherein the second semiconductor chip comprises a second semiconductor substrate and a second circuit area between the second semiconductor substrate and the bonding structure,
wherein at least one of the through-electrode structures penetrates through at least a portion of the second semiconductor chip or penetrates through the semiconductor pattern,
wherein a portion of the semiconductor pattern that is at a same height level with respect to an upper surface of the first semiconductor substrate as the second circuit area is free of a semiconductor integrated circuit, and
wherein the semiconductor pattern comprises an outer side surface vertically aligned with a side surface of the first semiconductor chip.

* * * * *